(12) United States Patent
Okumura

(10) Patent No.: US 10,777,678 B2
(45) Date of Patent: Sep. 15, 2020

(54) SEMICONDUCTOR DEVICE

(71) Applicant: FUJI ELECTRIC CO., LTD., Kawasaki (JP)

(72) Inventor: Keiji Okumura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/144,116

(22) Filed: Sep. 27, 2018

(65) Prior Publication Data

US 2019/0140095 A1 May 9, 2019

(30) Foreign Application Priority Data

Nov. 7, 2017 (JP) ................................. 2017-214981

(51) Int. Cl.
*H01L 29/76* (2006.01)
*H01L 29/78* (2006.01)
*H01L 29/06* (2006.01)
*H01L 29/423* (2006.01)
*H01L 29/08* (2006.01)
*H01L 29/10* (2006.01)
*H01L 29/739* (2006.01)
*H01L 29/66* (2006.01)
*H01L 29/16* (2006.01)

(52) U.S. Cl.
CPC ...... *H01L 29/7825* (2013.01); *H01L 29/0615* (2013.01); *H01L 29/0619* (2013.01); *H01L 29/0623* (2013.01); *H01L 29/0661* (2013.01); *H01L 29/086* (2013.01); *H01L 29/0865* (2013.01); *H01L 29/0878* (2013.01); *H01L 29/0882* (2013.01); *H01L 29/1095* (2013.01); *H01L 29/4236* (2013.01); *H01L 29/4238* (2013.01); *H01L 29/66348* (2013.01); *H01L 29/7397* (2013.01); *H01L 29/7811* (2013.01); *H01L 29/7813* (2013.01); *H01L 29/0638* (2013.01); *H01L 29/1608* (2013.01); *H01L 29/66068* (2013.01)

(58) Field of Classification Search
CPC ............ H01L 29/0615; H01L 29/0623; H01L 29/7825; H01L 29/0619
See application file for complete search history.

(56) References Cited

U.S. PATENT DOCUMENTS

| 8,716,717 | B2 | 5/2014 | Kawakami et al. |
| 2013/0140582 | A1 | 6/2013 | Kawakami et al. |
| 2015/0060938 | A1* | 3/2015 | Lu .......................... H01L 29/404 257/139 |
| 2015/0279931 | A1* | 10/2015 | Chen ................... H01L 29/7395 257/495 |

FOREIGN PATENT DOCUMENTS

| JP | 1-138759 A | 5/1989 |
| WO | 2012/049872 A1 | 4/2012 |

* cited by examiner

*Primary Examiner* — Samuel A Gebremariam

(57) ABSTRACT

A semiconductor device includes: an active area including a drift layer of a first conductivity type; and a voltage blocking area arranged around the active area and including an field relaxation region having a second conductivity type, being provided in an upper portion of the drift layer, wherein a depth of the field relaxation region decreases toward outside, and a spatial-modulation portion is provided at an outer end of the field relaxation region.

16 Claims, 27 Drawing Sheets

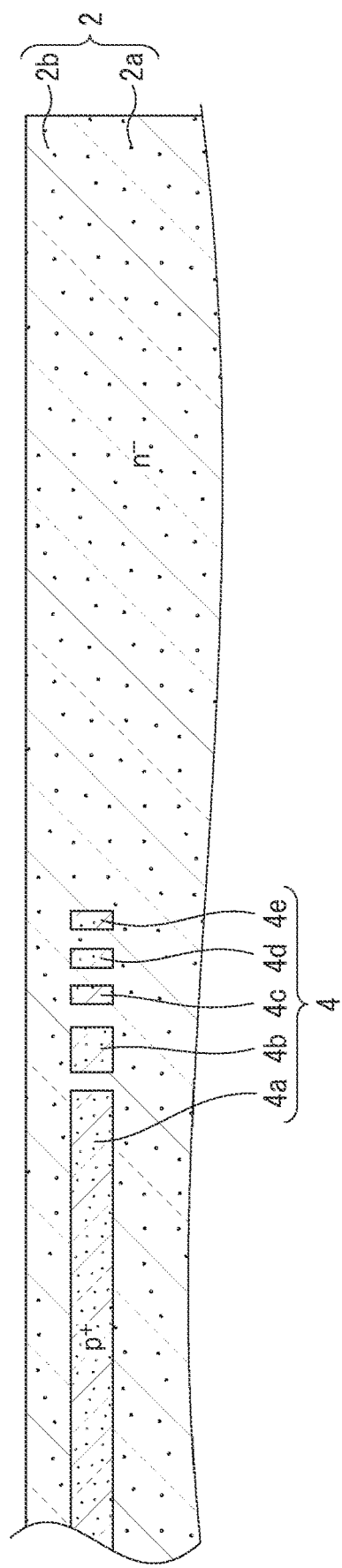
F I G. 4

US 10,777,678 B2

SEMICONDUCTOR DEVICE

CROSS-REFERENCE TO RELATED APPLICATION

This application claims benefit of priority under 35 USC 119 based on Japanese Patent Application No. 2017-214981 filed on Nov. 7, 2017, the entire contents of which are incorporated by reference herein.

BACKGROUND OF THE INVENTION

1. Field of the Invention

The present invention relates to a semiconductor device, and more particularly, to a technique for relaxing electric field crowding in a voltage blocking area of a semiconductor device.

2. Description of the Related Art

In order to relax electric field crowding in a voltage blocking area of a semiconductor device in the related art, a structure in which a reduced surface field (RESURF) layer implemented by a plurality of p-type ion-implanted layers are provided in a voltage blocking area has been proposed (refer to WO 2012/049872 A). In addition, a structure in which a p$^+$-type layer, a p$^-$-type layer, and a p$^{--}$-type layer are provided toward the outside in a voltage blocking area has been proposed (refer to JP 1-138759 A).

However, in the semiconductor devices disclosed in WO 2012/049872 A and JP 1-138759 A, there is a possibility that the electric field crowding in the voltage blocking area cannot be sufficiently relaxed and the breakdown voltage is lowered.

SUMMARY OF THE INVENTION

In view of the above problems, an object of the present invention is to provide a semiconductor device capable of relaxing electric field crowding in a voltage blocking area and improving a breakdown voltage.

An aspect of the present invention inheres in a semiconductor device encompassing: an active area including a drift layer of a first conductivity type; and a voltage blocking area arranged around the active area and including an field relaxation region having a second conductivity type, being provided in an upper portion of the drift layer, wherein a depth of the field relaxation region decreases toward outside, and a spatial-modulation portion is provided at an outer end of the field relaxation region

BRIEF DESCRIPTION OF THE DRAWINGS

FIG. 4 is a process cross-sectional view continuing from FIG. 3 illustrating an example of the method of manufacturing the voltage blocking area of the semiconductor device according to the first embodiment of the present invention;

DETAILED DESCRIPTION OF THE INVENTION

Figure 1:
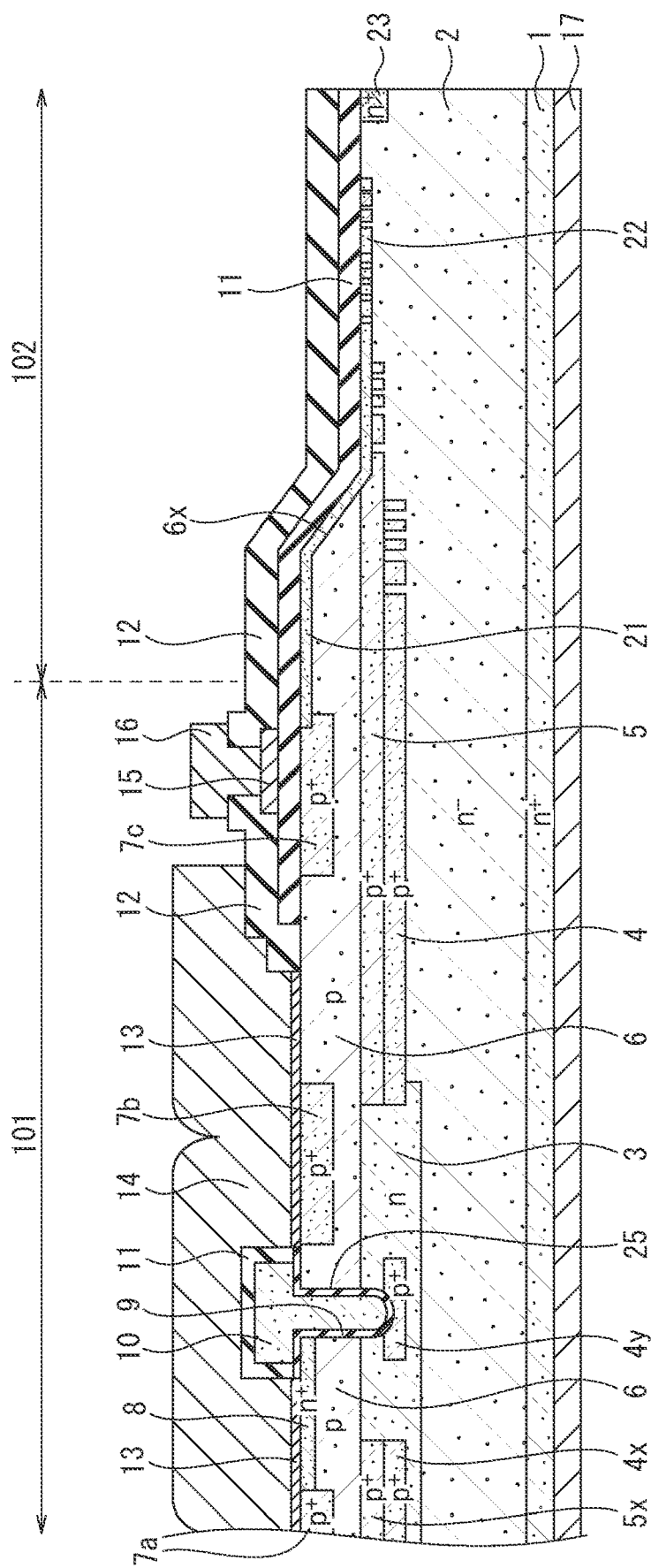
FIG. 1 is a cross-sectional view of a semiconductor device according to a first embodiment of the present invention.

With reference to the Drawings, first and second embodiments of the present invention will be described below. In the Specification and the Drawings, the same or similar elements are indicated by the same or similar reference numerals. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The first and second embodiments described below merely illustrate schematically semiconductor devices for specifying and giving shapes to the technical idea of the present invention, and the span of the technical idea is not limited to materials, shapes, structures, and relative positions of elements described herein.

In the Specification, a "first main-electrode region" is assigned to a semiconductor region which will be a source region or a drain region in a field-effect transistor (FET) or a static induction transistor (SIT), an emitter region or a collector region in an insulated gate bipolar transistor (IGBT) and an anode region or a cathode region in a static induction thyristor (SI Thy) or a gate turn-off (GTO) thyristor. A "second main-electrode region" is assigned to a semiconductor region which will not be the first main-electrode region and will be the source region or the drain region in the FET or the SIT, the emitter region or the collector region in the IGBT, and the anode region or the cathode region in the SI thyristor or the GTO thyristor. That is, when the first main-electrode region is the source region, the second main-electrode region means the drain region. When the first main-electrode region is the emitter region, the second main-electrode region means the collector region. When the first main-electrode region is the anode region, the second main-electrode region means the cathode region. In some appropriate cases, a function of the first main-electrode region and a function of the second main-electrode region are exchangeable each other by exchanging a bias relationship if the structure of the subject semiconductor device is symmetric.

In the following description, the definitions of directions such as "top" and "lower" are defined depending on cross-sectional views. For example, when the direction of a semiconductor device is changed by 90 degrees and is then observed, the terms "top" and "bottom" change to "left" and "right", respectively. When the observing direction of the semiconductor integrated circuit is changed by 180 degrees, the terms "top" and "bottom" shall be reversed. In the following description, an example in which a first conductivity type is an n-type and a second conductivity type is a p-type opposite to the first conductivity type will be described. However, the relationship between the conductivity types may be reversed such that the first conductivity type is a p-type and the second conductivity type is an n-type. In the Specification and the accompanying Drawings, semiconductor regions, being labeled with symbols "+" as superscript to "p" or "n", represent heavily doped semiconductor regions, of which the impurity concentration is higher than that of a semiconductor region without the superscript "+". And, the semiconductor regions, being labeled with symbols "−" as superscripts to "p" or "n", represent lightly doped semiconductor regions, of which the impurity concentration is lower than that of a semiconductor region without the superscript "−". Note that the heavily doped semiconductor regions or the lightly doped semiconductor regions, being labeled with superscript "+" or "−", do not mean the semiconductor regions which have strictly the same impurity concentrations.

First Embodiment

As illustrated in FIG. 1, a semiconductor device according to the first embodiment of the present invention includes an active area 101 and a voltage blocking area 102 arranged around the active area 101 to surround the active area 101. FIG. 1 illustrates a case where, as an active element, a MISFET having a trench-gate structure provided in the upper portion of a drift layer 2, which has a first conductivity type ($n^-$-type), is included in the active area 101.

A base region 6 having a second conductivity type (p-type) is arranged on the upper surface of the drift layer 2. Each of the drift layer 2 and the base region 6 is implemented by an epitaxial growth layer (hereinafter, abbreviated as an "epitaxial layer") made of SiC. $p^+$-type base-contact regions 7a, 7b, and 7c having an impurity concentration higher than that of the base region 6 are selectively provided in the upper portion of the base region 6. An $n^+$-type first main-electrode region (source region) 8 having an impurity concentration higher than that of the drift layer 2 is selectively provided in the upper portion of the base region 6 so as to be in contact with the base-contact region 7a.

A trench 25 is provided to penetrate the base region 6 from the upper surfaces of the source region 8 and the base region 6. A gate-insulating film 9 is provided on the bottom surface and the side surface of the trench 25. As the gate-insulating film 9, there may be adopted any one single layer film of a silicon oxide film ($SiO_2$ film), a silicon oxynitride (SiON) film, a strontium oxide (SrO) film, a silicon nitride ($Si_3N_4$) film, an aluminum oxide ($Al_2O_3$) film, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, and a bismuth oxide ($Bi_2O_3$) film or a composite film obtained by stacking a plurality of these films.

A gate electrode 10 is buried in the trench 25 with the gate-insulating film 9 interposed between the gate electrode 10 and the trench 25. As a material of the gate electrode 10, there may be used, for example, a polysilicon layer (doped-polysilicon layer) in which impurities such as phosphorus (P) are added at a high impurity concentration.

An n-type current spreading layer (CSL) 3 having an impurity concentration higher than that of the drift layer 2 is selectively provided in the upper portion of the drift layer 2. The bottom of the trench 25 reaches the CSL 3. A $p^+$-type gate-bottom protection-region 4y is provided in the inner portion of the CSL 3 so as to be in contact with the bottom of the trench 25. In the inner portion of the CSL 3, below the base-contact region 7a, a first base-bottom buried-region 4x is provided at the same depth as the gate-bottom protection-region 4y to be separated from the gate-bottom protection-region 4y. In the upper portion of the CSL 3, a second base-bottom buried-region 5x is provided so as to be sandwiched between the upper surface of the first base-bottom buried-region 4x and the lower surface of the base region 6.

In the inner portion of the drift layer 2, below the base-contact region 7c, a first base-bottom buried-region 4 is provided at the same depth as the gate-bottom protection-region 4y to be separated from the gate-bottom protection-region 4y. In the upper portion of the drift layer 2, a second base-bottom buried-region 5 is provided so as to be sandwiched between the upper surface of the first base-bottom buried-region 4 and the lower surface of the base region 6. The left end of the first base-bottom buried-region 4 and the second base-bottom buried-region 5 is in contact with the CSL 3.

On the upper surface of the gate electrode 10, a first main-electrode (source electrode) 14 is arranged separately from a gate-surface electrode (not illustrated) located on the back of the paper surface with an interlayer-insulating film 11 interposed between the gate electrode 10 and the source electrode 14. As the interlayer-insulating film 11, there may be adopted a non-doped silicon oxide film ($SiO_2$ film) not containing phosphorus (P) or boron (B), which is called "NSG". However, as the interlayer-insulating film 11, there may be adopted a phosphosilicate glass (PSG) film, a borosilicate glass (BSG) film, a borophosphosilicate glass (BPSG) film, a silicon nitride ($Si_3N_4$) film or the like. A source electrode 14 is electrically connected to the source region 8 and the base-contact regions 7a and 7b. A barrier-metal layer 13 is arranged under the source electrode 14. The barrier-metal layer 13 is arranged so as to be in metallurgically contact with the source region 8 and the base-contact regions 7a and 7b, respectively. For example, the barrier-metal layer 13 is implemented by a nickel (Ni) film, and the source electrode 14 is implemented by an aluminum (Al) film. For the gate-surface electrode, the same material as the source electrode 14 may be used.

A wiring layer 15 is arranged on the upper surface of the base-contact region 7c with an interlayer-insulating film 11 interposed between the wiring layer 15 and the base-contact region 7c, and a gate-electrode pad 16 is arranged on the upper surface of the wiring layer 15. Although not illustrated, the gate-electrode pad 16 is electrically connected to the gate electrode 10 with the wiring layer 15 interposed between the gate-electrode pad 16 and the gate electrode 10. A protective film 12 is arranged around the gate-electrode pad 16. The interlayer-insulating film 11 and the protective film 12 extend toward the voltage blocking area 102 side.

An $n^+$-type second main-electrode region (drain region) 1 is arranged on the lower surface of the drift layer 2. The drain region 1 is implemented by a semiconductor substrate (SiC substrate) made of SiC. A second main-electrode (drain electrode) 17 is arranged on the lower surface of the drain region 1. As the drain electrode 17, there may be used, for example, a single layer film made of gold (Au), a stacked-metal film in which Al, nickel (Ni) and Au are stacked in this order, and in addition, a metallic film of molybdenum (Mo), tungsten (W), or the like may be laminated at the bottom layer of the stacked-metal film.

During the operation of the semiconductor device according to the first embodiment of the present invention, when a positive voltage is applied to the drain electrode 17 and a positive voltage equal to or higher than a threshold value is applied to the gate electrode 10, an inversion layer (channel) is formed in a portion of the base region 6 close to the side surface of the trench 25, so that the semiconductor device can turn on. The inversion layer is formed on the surface of the base region 6 exposed on the side surface of the trench 25 which is the interface between the gate-insulating film 9 sandwiched at the position where the base region 6 faces the gate electrode 10 and the base region 6. In the ON state, a current flows from the drain electrode 17 to the source electrode 14 through the drain region 1, the drift layer 2, the CSL 3, the inversion layer of the base region 6, and the source region 8. On the other hand, when the voltage applied to the gate electrode 10 is lower than the threshold value, the inversion layer is not formed in the base region 6, so that the semiconductor device is in the OFF state, and no current flows from the drain electrode 17 to the source electrode 14.

As illustrated in FIG. 1, the first base-bottom buried-region 4 extends from the left active area 101 side to the voltage blocking area 102 and functions as the first electric-field relaxation-layer 4 in the voltage blocking area 102 side. In addition, the second base-bottom buried-region 5 extends from the left active area 101 side to the voltage blocking area 102 and functions as the second electric-field relaxation-layer 5 in the voltage blocking area 102 side.

Figure 2:
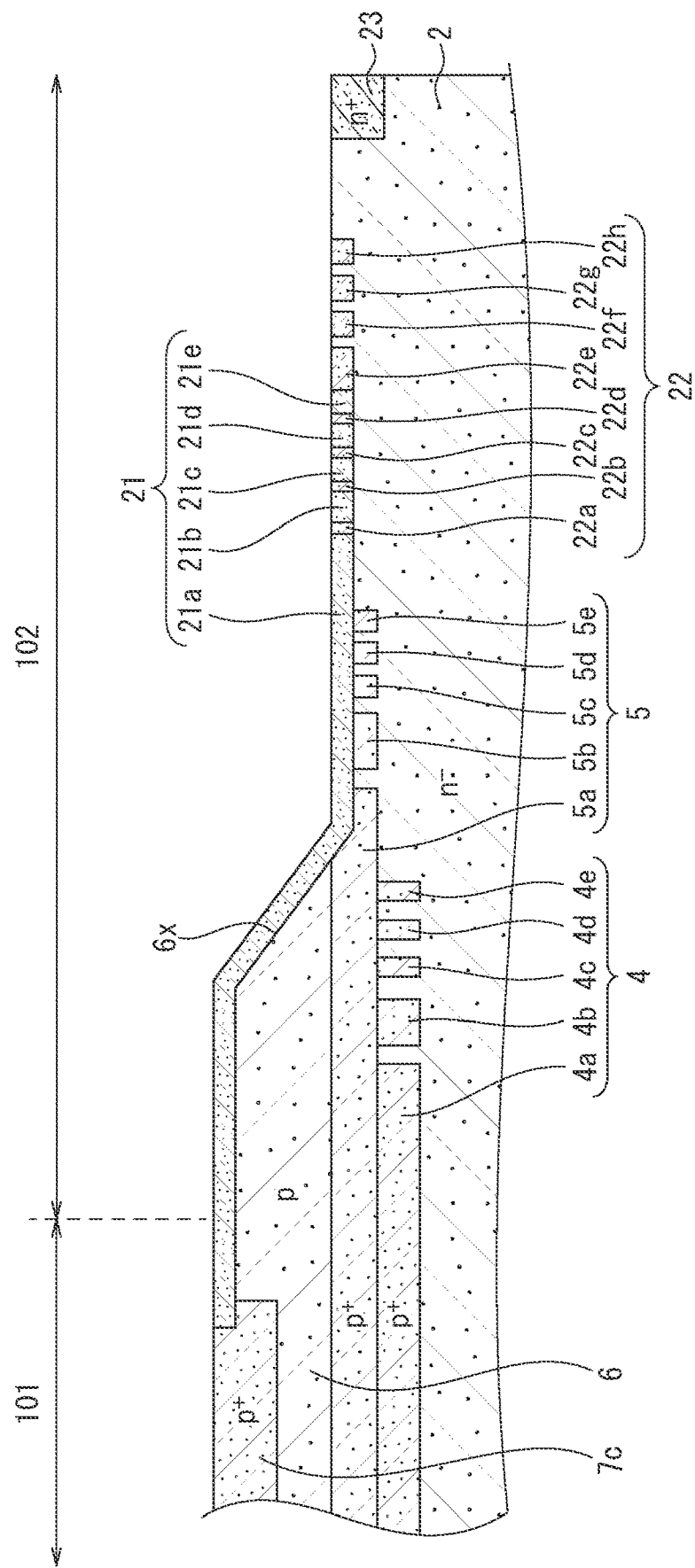
FIG. 2 is a cross-sectional view of a voltage blocking area of the semiconductor device according to the first embodiment of the present invention.

FIG. 2 illustrates a partial enlarged view of the upper portion of the drift layer 2 in the voltage blocking area 102 side illustrated in FIG. 1. In FIG. 2, the interlayer-insulating film 11, the protective film 12, the wiring layer 15, and the gate-electrode pad 16 illustrated in FIG. 1 are omitted in illustration.

The voltage blocking area 102 includes a p-type field relaxation region (4, 5, 21, 22) provided in the upper portion of the drift layer 2. In the voltage blocking area 102, the depth of the field relaxation region (4, 5, 21, 22) decreases toward the outside, and the spatial-modulation portion is provided at the outer end of the field relaxation region (4, 5, 21, 22). The field relaxation region (4, 5, 21, 22) includes a first electric-field relaxation-layer 4, a second electric-field relaxation-layer 5, and a junction-termination structure-portion (21, 22). The second electric-field relaxation-layer 5 extends to the outer side of the first electric-field relaxation-layer 4 so as to be in contact with the upper surface of the first electric-field relaxation-layer 4. The junction-termination structure-portion (21, 22) extends to the outer side of the second electric-field relaxation-layer 5 so as to be in contact with the upper surface of the second electric-field relaxation-layer 5.

The first electric-field relaxation-layer 4 includes a $p^+$-type main-body portion 4a extending continuously from the side of the active area 101 and a $p^+$-type spatial-modulation portions 4b, 4c, 4d and 4e having the same impurity concentration as that of the main-body portion 4a and provided outside the main-body portion 4a. The spatial-modulation portions 4b, 4c, 4d, and 4e are provided to be separated from each other in a concentric ring shape. For example, the spatial-modulation portions 4b, 4c, 4d, and 4e implement a spatial-modulation pattern of which the width becomes narrower and the interval becomes wider toward the outside. Since the concentric ring shaped pattern of the spatial-modulation portions 4b, 4c, 4d, and 4e is included, the doping profile of p-type impurity effectively decreases toward the outside, so that it is possible to relax the electric field crowding.

The second electric-field relaxation-layer 5 extends to the outer side of the first electric-field relaxation-layer 4 so as to be in contact with the upper surface of the first electric-field relaxation-layer 4. The second electric-field relaxation-layer 5 may have the same impurity concentration as that of the first electric-field relaxation-layer 4 or may have an impurity concentration lower than that of the first electric-field relaxation-layer 4. For example, the impurity concentration of the first electric-field relaxation-layer 4 may be $5\times10^{17}$ cm$^{-3}$ to $2\times10^{19}$ cm$^{-3}$, and the impurity concentration of the second electric-field relaxation-layer 5 may be $3\times10^{17}$ cm$^{-3}$ to $1\times10^{19}$ cm$^{-3}$. The second electric-field relaxation-layer 5 includes a main-body portion 5a extending continuously from the side of the active area 101 and spatial-modulation portions 5b, 5c, 5d, and 5e having the same impurity concentration as that of the main-body portion 5a and provided outside the main-body portion 5a. The spatial-modulation portions 5b, 5c, 5d, and 5e are provided to be separated from each other in a concentric ring shape. For example, the spatial-modulation portions 5b, 5c, 5d, and 5e implement a spatial-modulation pattern of which horizontal level is shallower than those of the spatial-modulation portions 4b, 4c, 4d, and 4e and of which the width becomes narrower and the interval becomes wider toward the outside. Since the concentric ring shaped spatial-modulation portions 5b, 5c, 5d, and 5e are included, the doping profile of the p-type impurities effectively decreases toward the outside, so that it is possible to relax the electric field crowding.

The base region 6 includes a recessed portion 6x. A junction-termination structure-portion (21, 22) called "junction termination extension (JTE)" is provided over a range from the base-contact region 7c through the upper portion of the base region 6 to the vicinity of the outer end of the upper portion of the drift layer 2. The junction-termination structure-portion (21, 22) extends to the outer side of the second electric-field relaxation-layer 5. The junction-termination structure-portion (21, 22) includes a $p^-$-type first junction termination region (first JTE region) 21 having an impurity concentration lower than that of the base region 6 and a $p^{---}$-type second junction termination region (second JTE region) 22 provided in an outer side of the first JTE region 21 and having an impurity concentration lower than that of the first JTE region 21. For example, the impurity concentration of the base region 6 may be $2\times10^{16}$ cm$^{-3}$ to $2\times10^{18}$ cm$^{-3}$, the impurity concentration of the first JTE region 21 may be $2\times10^{16}$ cm$^{-3}$ to $2\times10^{18}$ cm$^{-3}$, and the impurity concentration of the second JTE region 22 may be $1\times10^{16}$ cm$^{-3}$ to $1\times10^{18}$ cm$^{-3}$.

The first JTE region 21 includes, over a range from the base-contact region 7c to the upper portion of the drift layer 2, a main-body portion 21a extending to the outer side of the second electric-field relaxation-layer 5 and spatial-modulation portions 21b, 21c, 21d and 21e provided outside of the main-body portion 21a. The spatial-modulation portions 21b, 21c, 21d, and 21e are provided to be separated from each other in a concentric ring shape. For example, the spatial-modulation portions 21b, 21c, 21d, and 21e implement a spatial-modulation pattern of which horizontal level is shallower than those of the spatial-modulation portions 5b, 5c, 5d, and 5e and of which the width becomes narrower and the interval becomes wider toward the outside.

The second JTE region 22 includes spatial-modulation portions 22a, 22b, 22c, 22d, 22e, 22f, 22g, and 22h which have the same impurity concentration and are provided to be separated from each other in a concentric ring shape. Among these spatial-modulation portions 22a, 22b, 22c, 22d, 22e, 22f, 22g, and 22h, the spatial-modulation portions 22a, 22b, 22c, and 22d located in the inner side are alternately provided with respect to the spatial-modulation portions 21b, 21c, 21d, and 21e of the first JTE region 21. In addition, the spatial-modulation portions 22e, 22f, 22g, and 22h located in the outer side implement, for example, a spatial-modulation pattern of which the width becomes narrower and the interval becomes wider toward the outside.

Since the spatial-modulation portions 21b, 21c, 21d, and 21e of the first JTE region 21 and the spatial-modulation portions 22a, 22b, 22c, 22d, 22e, 22f, 22g, and 22h of the second JTE region 22 are included, the doping profile of the p-type impurity effectively decreases toward the outside, so that it is possible to relax the electric field crowding.

At the outer end of the voltage blocking area 102, an $n^+$-type channel stopper 23 is provided in the upper portion of the drift layer 2 in a concentric ring shape. Instead of the $n^+$-type channel stopper 23, a $p^+$-type channel stopper may be provided.

Figure 27:
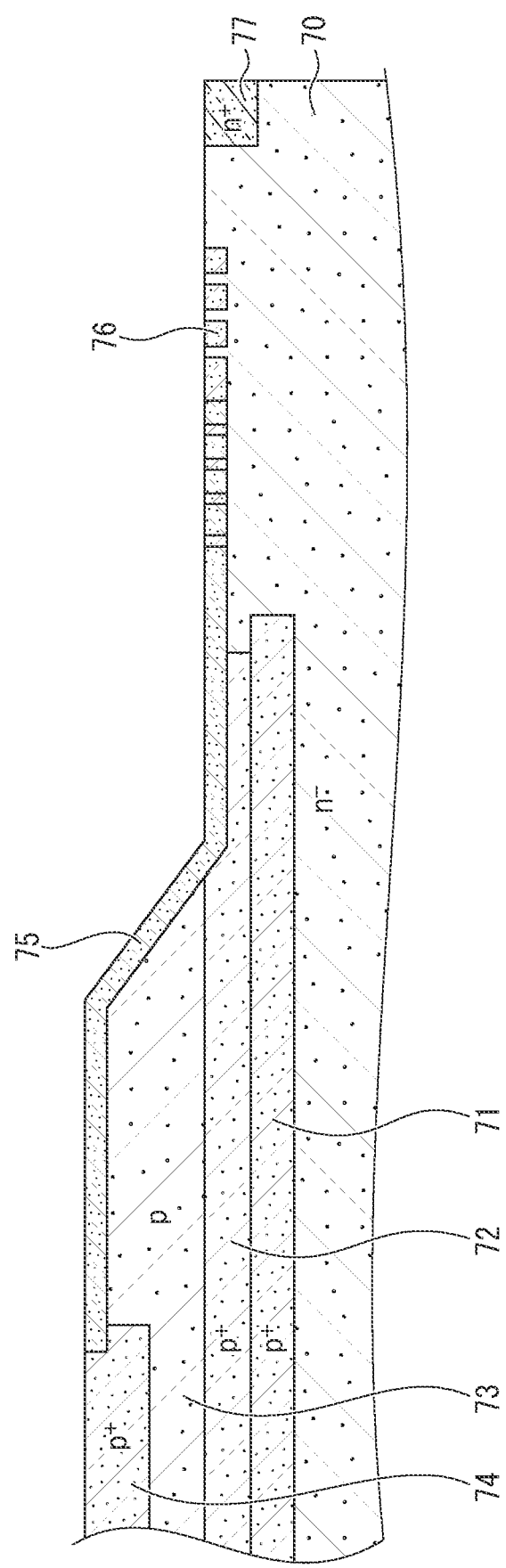
FIG. 27 is a cross-sectional view of a voltage blocking area of a semiconductor device according to a comparative example.

Herein, a comparative example of the semiconductor device according to the first embodiment of the present invention will be described. Regarding the semiconductor device according to the comparative example, as illustrated in FIG. 27, in a voltage blocking area provided in a peripheral portion, a $p^+$-type first base-bottom buried-region 71 and a $p^+$-type second base-bottom buried-region 72 extend continuously from the active area in the upper portion of a drift layer 70. A p-type base region 73 is arranged on the upper surface of the drift layer 70. A $p^+$-type base-contact region 74 is provided in the upper portion of the base region 73. An $n^+$-type channel stopper 77 is provided at the outer end of the drift layer 70.

A junction-termination structure-portion (75, 76) is provided over a range from the base-contact region 74 to the vicinity of the outer end of the drift layer 70. The junction-termination structure-portion (75, 76) is implemented by a $p^-$-type first JTE region 75 and a $p^{---}$-type second JTE region 76 provided outside the first JTE region 75.

In the semiconductor device according to the comparative example, the first base-bottom buried-region 71 and the second base-bottom buried-region 72 are provided as a pattern continuous from the active area, but no spatial-modulation portion is provided, and thus, the first base-bottom buried-region 71 and the second base-bottom buried-region 72 do not function as the field relaxation region. For this reason, the electric field crowding occurs at the outer ends of the first base-bottom buried-region 71 and the second base-bottom buried-region 72.

On the other hand, according to the semiconductor device of the first embodiment, as illustrated in FIGS. 1 and 2, the first base-bottom buried-region 4 and the second base-bottom buried-region 5, which extend continuously from the active area 101 side, are effectively used as the first electric-field relaxation-layer 4 and the second electric-field relaxation-layer 5. Then, the depth of each layer implementing the field relaxation region (4, 5, 21, 22) decreases toward the outside, and the spatial-modulation pattern is provided at the outer end side of each layer of the field relaxation region (4, 5, 21, 22), so that it is also possible to relax the electric field crowding in the depth direction. Therefore, the breakdown voltage of the voltage blocking area 102 can be improved, a high breakdown voltage device can be realized, and the margin of the active breakdown voltage and the edge breakdown voltage can be expanded.

In addition, the deeper the depth of the field relaxation region (4, 5, 21, 22), the higher the impurity concentration of the field relaxation region (4, 5, 21, 22), and the impurity concentration of the field relaxation region (4, 5, 21, 22) decreases toward the outside, so that it is possible to improve the relaxation effect of the electric field crowding.

Next, a method of manufacturing the semiconductor device according to the embodiment of the present invention will be described with reference to FIGS. 3 to 9, while focusing on the voltage blocking area 102 provided in a peripheral portion of a chip. In addition, the manufacturing method described below is merely an example and can be realized by various other manufacturing methods including modified examples as long as the manufacturing methods are included in the technical scope prescribed by claims of the present invention.

Figure 3:
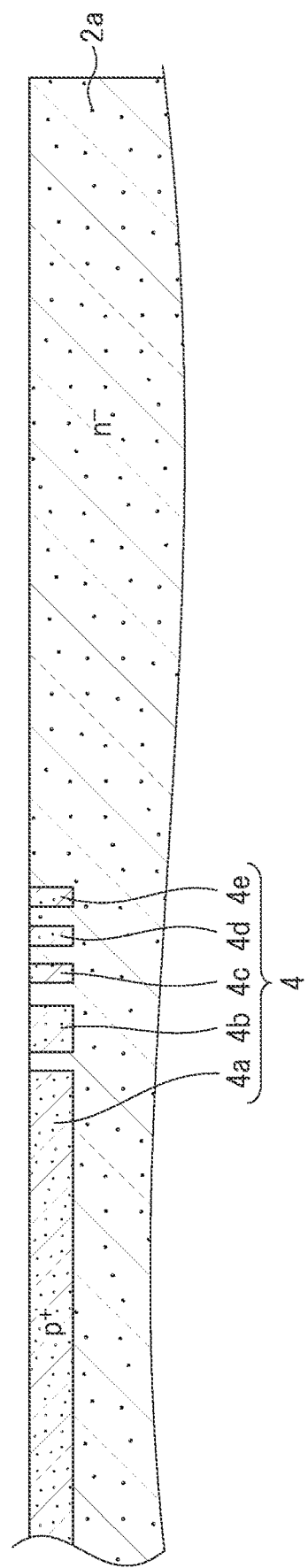
FIG. 3 is a process cross-sectional view illustrating an example of a method of manufacturing the voltage blocking area of the semiconductor device according to the first embodiment of the present invention.

First, an n$^+$-type semiconductor substrate—SiC substrate—to which n-type impurities of as nitrogen (N) or the like are doped is prepared. An n$^-$-type first drift layer 2a is epitaxially grown on the upper surface of the drain region 1 by using the n$^+$-type SiC substrate as the drain region 1. Next, a photoresist film is coated on the upper surface of the first drift layer 2a, and the photoresist film is delineated by photolithography technique. By using the delineated photoresist film as an ion-implantation mask, p-type impurity ions such as aluminum (Al) are implanted with multiple acceleration energies. After removal of the photoresist film, annealing is performed to activate the p-type impurity ions. As a result, as illustrated in FIG. 3, a p$^+$-type first electric-field relaxation-layer (first base-bottom buried-region) 4 is formed in the upper portion of the first drift layer 2a. The first electric-field relaxation-layer 4 includes a main-body portion 4a extending continuously from the active area 101 side and spatial-modulation portions 4b, 4c, 4d, and 4e provided to the outer side of the main-body portion 4a so as to implement a concentric ring shaped spatial-modulation pattern. At the same time, in the active area 101 side illustrated in FIG. 1, the p$^+$-type gate-bottom protection-region 4y and the p$^+$-type first base-bottom buried-region 4x are formed in the upper portion of the first drift layer 2a.

Figure 5:
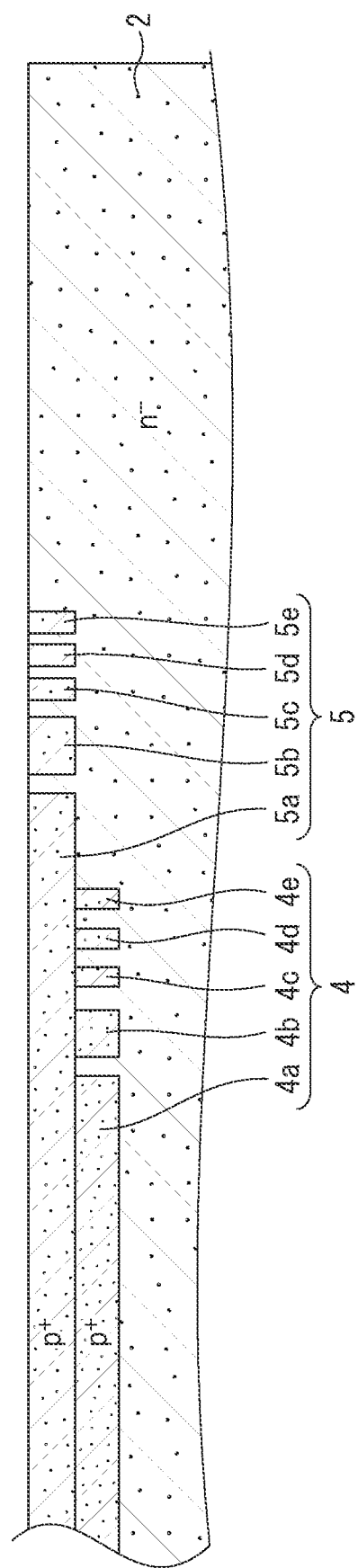
FIG. 5 is a process cross-sectional view continuing from FIG. 4 illustrating the example of the method of manufacturing the voltage blocking area of the semiconductor device according to the first embodiment of the present invention.

Next, as illustrated in FIG. 4, an n$^-$-type second drift layer 2b is epitaxially grown on the upper surface of the first drift layer 2a. The drift layer 2 is implemented by the first drift layer 2a and the second drift layer 2b, and the first electric-field relaxation-layer 4 is buried in the drift layer 2. Next, a photoresist film is coated on the upper surface of the drift layer 2, and the photoresist film is delineated by photolithography technique. By using the delineated photoresist film as an ion-implantation mask, p-type impurity ions such as Al are implanted with multiple acceleration energies. After removal of the photoresist film, annealing is performed to activate the p-type impurity ions. As a result, as illustrated in FIG. 5, a p$^+$-type second electric-field relaxation-layer (second base-bottom buried-region) 5 is formed in the upper portion of the drift layer 2 so as to be in contact with the upper surface of the first electric-field relaxation-layer 4. The second electric-field relaxation-layer 5 includes a main-body portion 5a extending continuously from the active area 101 side and spatial-modulation portions 5b, 5c, 5d, and 5e provided to the outer side of the main-body portion 5a so as to implement a concentric ring shaped spatial-modulation pattern. At the same time, in the active area 101 side illustrated in FIG. 1, the second base-bottom buried-region 5x is formed in the upper portion of the drift layer 2.

Figure 6:
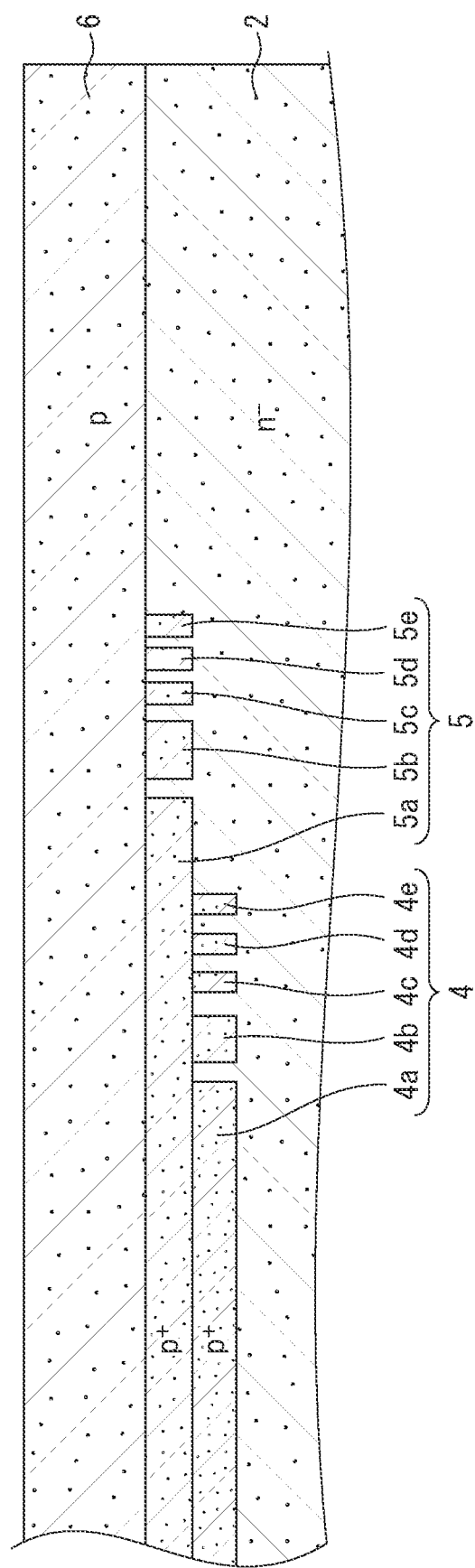
FIG. 6 is a process cross-sectional view continuing from FIG. 5 illustrating the example of the method of manufacturing the voltage blocking area of the semiconductor device according to the first embodiment of the present invention.
Figure 7:
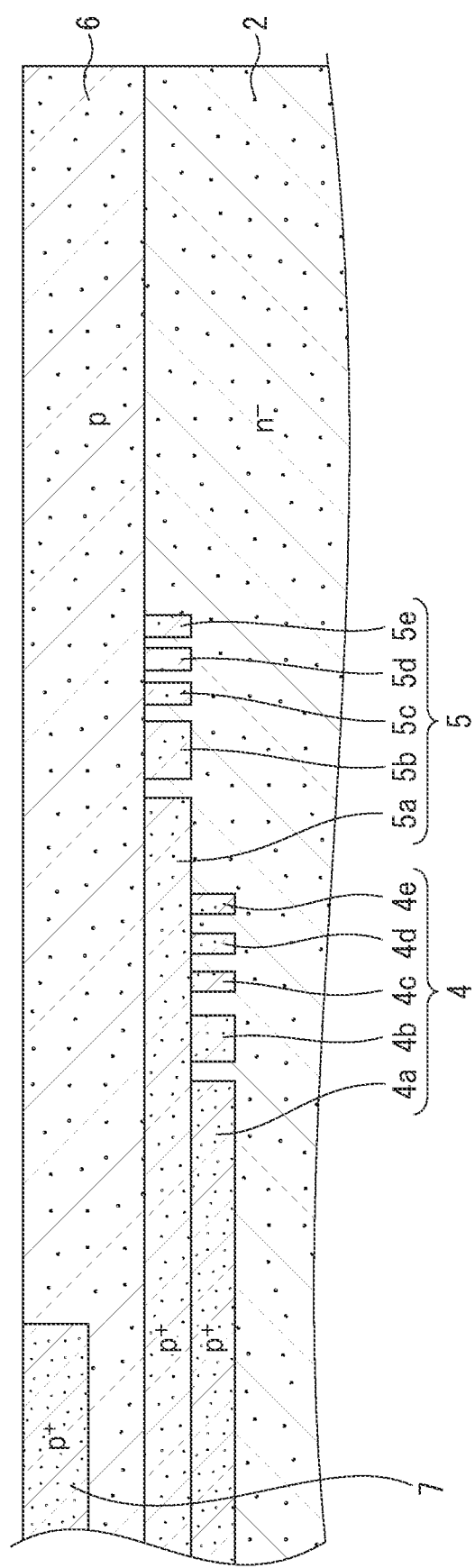
FIG. 7 is a process cross-sectional view continuing from FIG. 6 illustrating the example of the method of manufacturing the voltage blocking area of the semiconductor device according to the first embodiment of the present invention.

Next, as illustrated in FIG. 6, a p-type base region 6 is epitaxially grown on the upper surface of the drift layer 2. Then, a photoresist film is coated on the upper surface of the base region 6, and the photoresist film is delineated by photolithography technique. By using the delineated photoresist film as an ion-implantation mask, p-type impurity ions such as Al are implanted with multiple acceleration energies. After removal of the photoresist film, annealing is performed to activate the p-type impurity ions. As a result, as illustrated in FIG. 7, a p$^+$-type base-contact region 7c is formed in the upper portion of the base region 6. At the same time, in the active area 101 side illustrated in FIG. 1, p$^+$-type base-contact regions 7a and 7b are formed in the upper portion of the drift layer 2.

Figure 8:
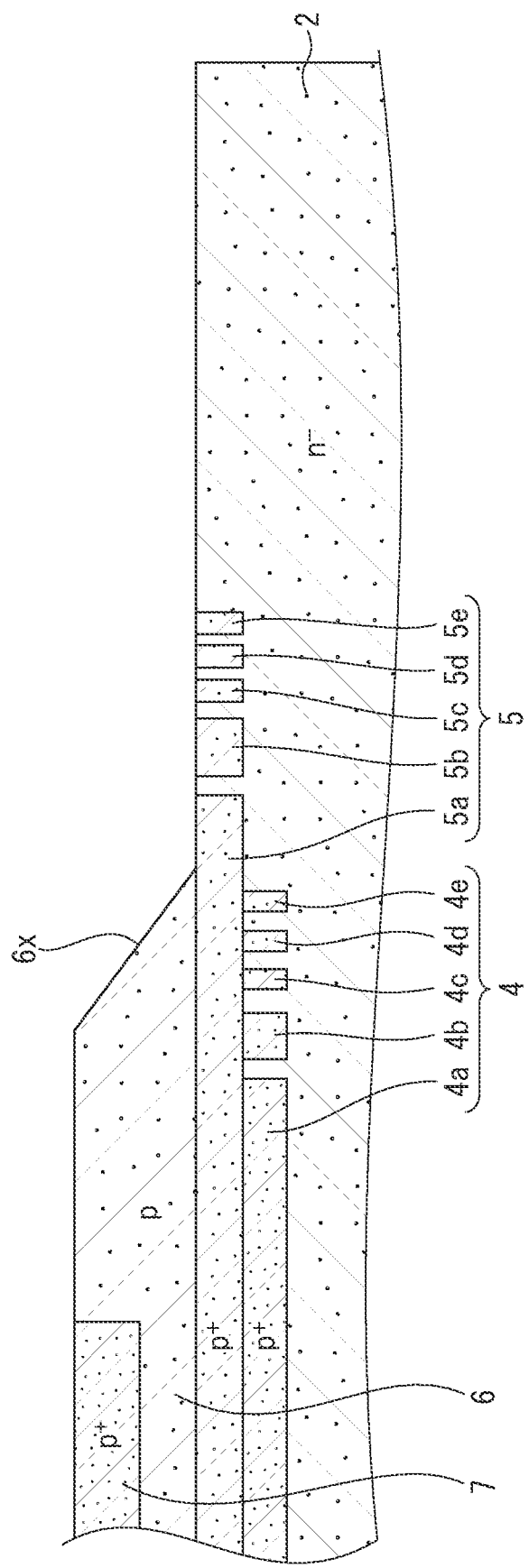
FIG. 8 is a process cross-sectional view continuing from FIG. 7 illustrating the example of the method of manufacturing the voltage blocking area of the semiconductor device according to the first embodiment of the present invention.

Next, a photoresist film is coated on the upper surface of the base region 6, and the photoresist film is delineated by photolithography technique. By using the delineated photoresist film as an etching mask, a portion of an outer periphery of the base region 6 is selectively removed by wet etching or the like. After that, the photoresist film is removed by wet processing or the like. As a result, as illustrated in FIG. 8, a recessed portion 6x having a slope in the base region 6 is formed, and the upper surface of the drift layer 2 is exposed to the outside of the voltage blocking area 102.

Figure 9:
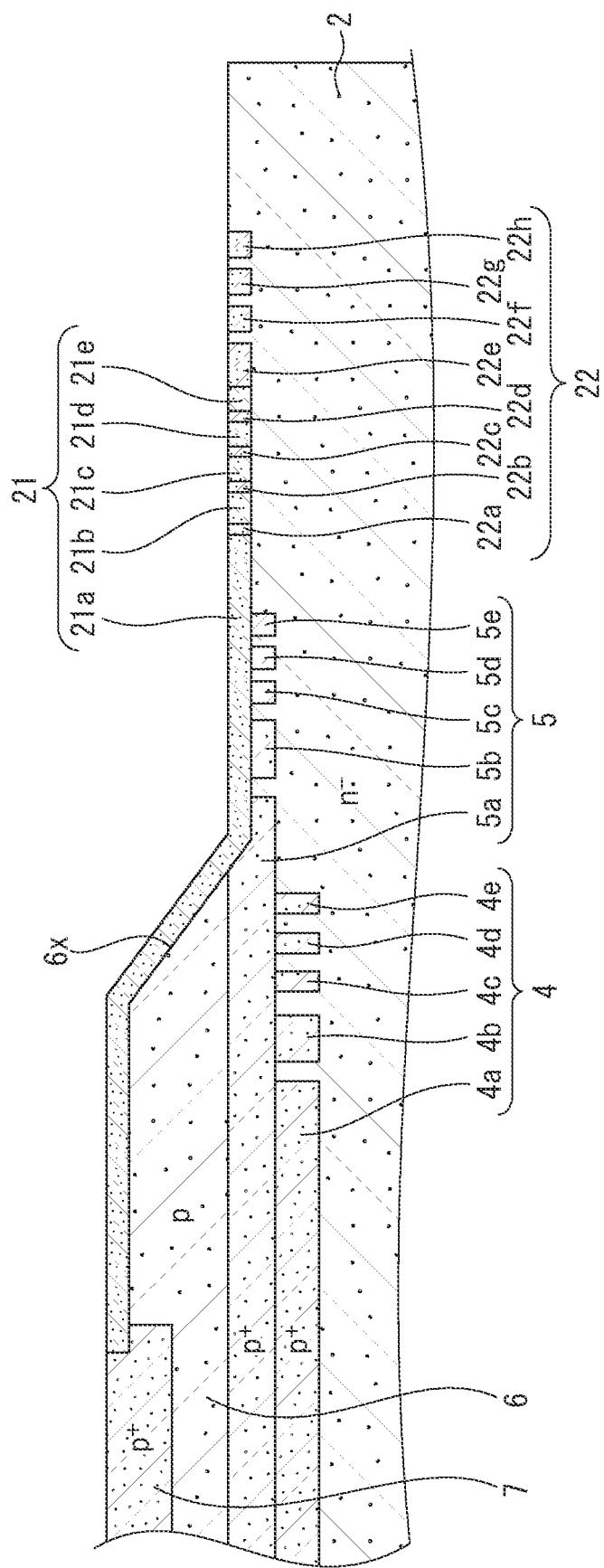
FIG. 9 is a process cross-sectional view continuing from FIG. 8 illustrating the example of the method of manufacturing the voltage blocking area of the semiconductor device according to the first embodiment of the present invention.

Next, as illustrated in FIG. 9, in a photolithography technique in which mask alignment is performed twice, by performing ion implantation corresponding to the twice mask alignment, and after that, by annealing, a p$^-$-type first JTE region 21 is formed. The p$^-$-type first JTE region 21 is formed so as to extend over the base-contact region 7c, the base region 6, the second electric-field relaxation-layer 5, and the drift layer 2. For example, at the time of forming the first JTE region 21, a first ion-implantation mask delineated by photolithography technique is used for the center side (inner side) region. By using the first ion-implantation mask, n-type impurity ions such as N are selectively implanted with multiple projected-ranges into the p$^+$-type base-contact region 7c, the p-type base region 6, and the p$^+$-type second electric-field relaxation-layer 5. In addition, with respect to the outer end side, by using a second ion-implantation mask delineated by photolithography technique, p-type impurity ions such as Al are selectively implanted with multiple projected-ranges into the n-type drift layer 2. After that, by annealing, a portion of the p-type impurities in the upper portions of the base-contact region 7c, the base region 6 and the second electric-field relaxation-layer 5 are compensated by the activated n-type impurities, so that a p$^-$-type first JTE region 21 is formed. The implantation of p-type impurity ions by using the second ion-implantation mask may be performed before the implantation of n-type impurity ions by using the first ion-implantation mask.

On the other hand, at the time of forming the p$^{--}$-type second JTE region 22 having an impurity concentration lower than that of the first JTE region 21 outside the first JTE region 21, p-type impurity ions such as Al at a dose smaller than that at the time of ion implantation of the first JTE region 21 are implanted with multiple projected-ranges into the drift layer 2. The annealing after the ion implantation may be performed together with the annealing at the time of forming the first JTE region 21.

According to the method of manufacturing the semiconductor device pertaining to the first embodiment of the present invention, the occurrence of the electric field crowding in the voltage blocking area can be efficiently prevented by a plurality of the spatial-modulation patterns having different depths of the lower ends, so that it is possible to realize the semiconductor device capable of improving the breakdown voltage.

(Modified Example of First Embodiment)

Figure 10:
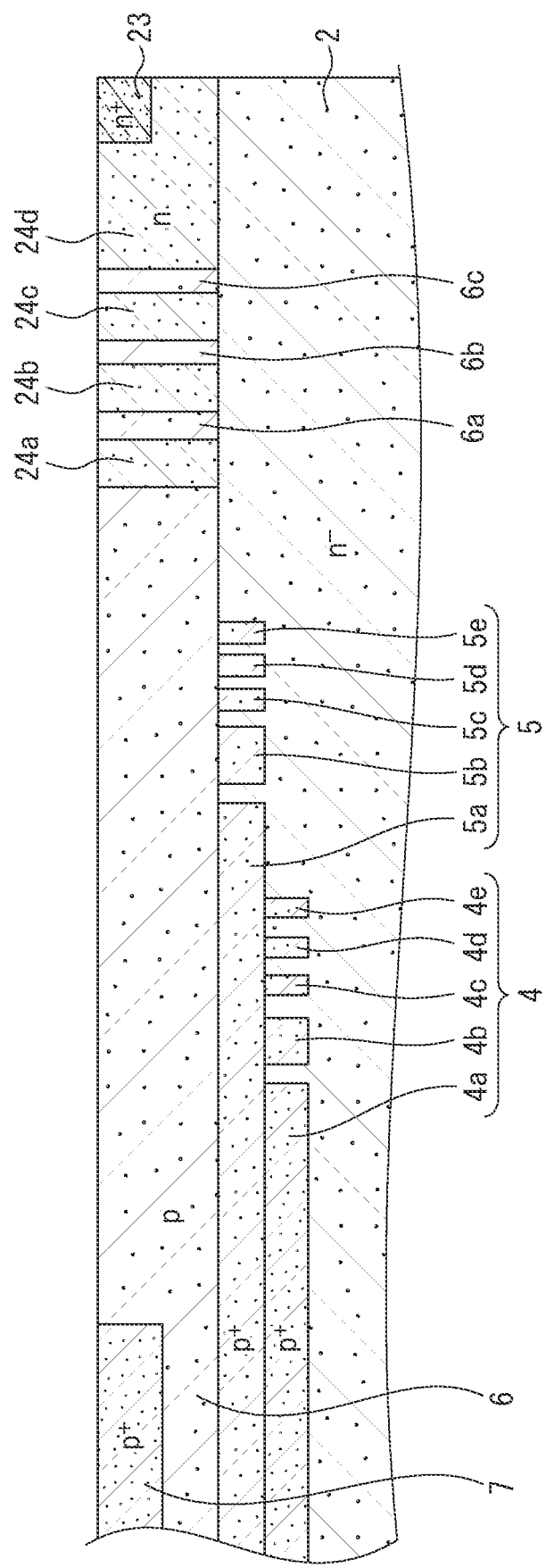
FIG. 10 is a cross-sectional view of a voltage blocking area of a semiconductor device according to a modified example of the first embodiment of the present invention.

FIG. 10 illustrates a voltage blocking area of a semiconductor device according to a modified example of the first embodiment of the present invention. As illustrated in FIG. 10, in the voltage blocking area of the semiconductor device according to the modified example of the first embodiment of the present invention, the p-type base region 6 provided on the upper surface of the drift layer 2 has no recessed portion, and extends to the vicinity of the outer end of the voltage blocking area to function as the third electric-field relaxation-layer 6.

In the voltage blocking area of the semiconductor device according to the modified example of the first embodiment of the present invention, the field relaxation region (4, 5, 6, 6a, 6b, 6c) is implemented by the first electric-field relaxation-layer 4, the second electric-field relaxation-layer 5, and the third electric-field relaxation-layer 6 provided with the spatial-modulation portions 6a, 6b, and 6c. The third electric-field relaxation-layer 6 extends to the outer side of the second electric-field relaxation-layer 5 so as to be in contact with the upper surface of the second electric-field relaxation-layer 5. In the outer side of the third electric-field relaxation-layer 6, p-type spatial-modulation portions 6a, 6b, and 6c are provided in a concentric ring shape. The spatial-modulation portions 6a, 6b, and 6c are alternately provided with respect to the n-type regions 24a, 24b, 24c, and 24d. A channel stopper 23 is provided in the upper portion of the n-type region 24d located at the outer end of the voltage blocking area.

According to the semiconductor device pertaining to the modified example of the first embodiment of the present invention, since the field relaxation region (4, 5, 6, 6a, 6b, 6c) is implemented by the first electric-field relaxation-layer 4, the second electric-field relaxation-layer 5, and the third electric-field relaxation-layer 6 provided with the spatial-modulation portions 6a, 6b, and 6c, the occurrence of electric field crowding in the voltage blocking area can be efficiently prevented by a plurality of the spatial-modulation patterns having different depths of the lower ends, so that it is possible to improve the breakdown voltage. In addition, the structure of the junction-termination structure-portion (21, 22) illustrated in FIGS. 1 and 2 can be replaced by the third electric-field relaxation-layer 6 provided with the spatial-modulation portions 6a, 6b, and 6c, and the number of layers and the number of processes can be reduced.

Figure 11:
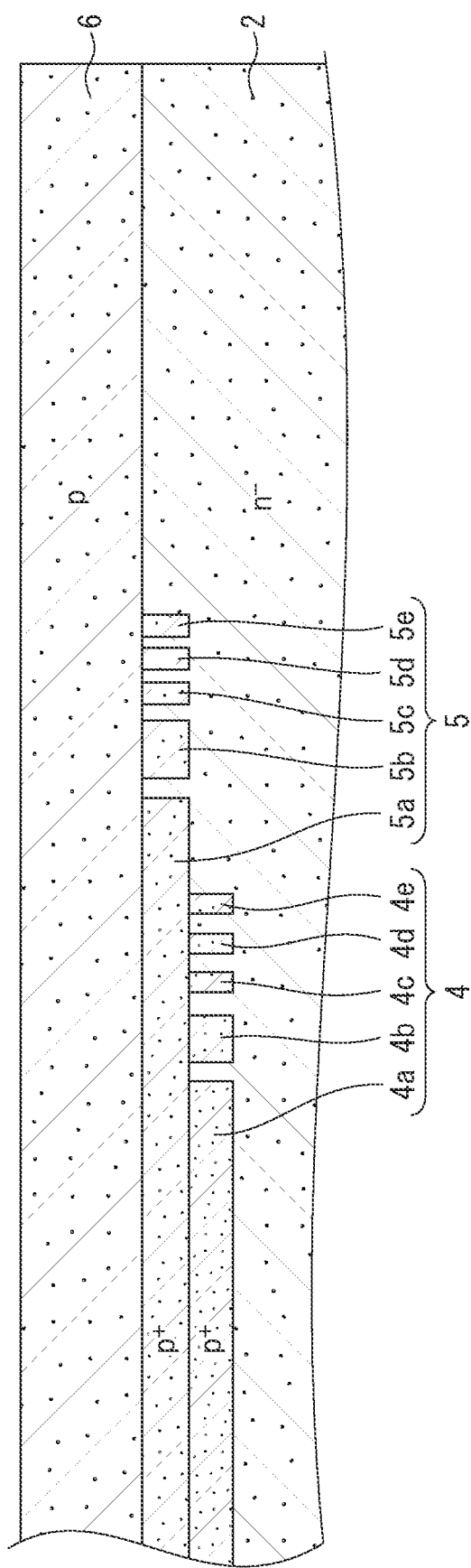
FIG. 11 is a process cross-sectional view illustrating an example of the method of manufacturing the voltage blocking area of the semiconductor device according to the modified example of the first embodiment of the present invention.

As an example of a method of manufacturing the semiconductor device according to the modified example of the first embodiment of the present invention, the first electric-field relaxation-layer 4 and the second electric-field relaxation-layer 5 are formed by the same procedure as those in FIGS. 3 to 5. After that, as illustrated in FIG. 11, a p-type base region (third electric-field relaxation-layer) 6 is epi-taxially grown on the upper surface of the drift layer 2. After that, a photoresist film is coated on the upper surface of the base region 6, and the photoresist film is delineated by photolithography technique. By using the delineated photoresist film as an ion-implantation mask, n-type impurity ions such as nitrogen (N) for forming the n-type regions 24a, 24b, 24c and 24d are implanted with multiple acceleration energies.

Figure 12:
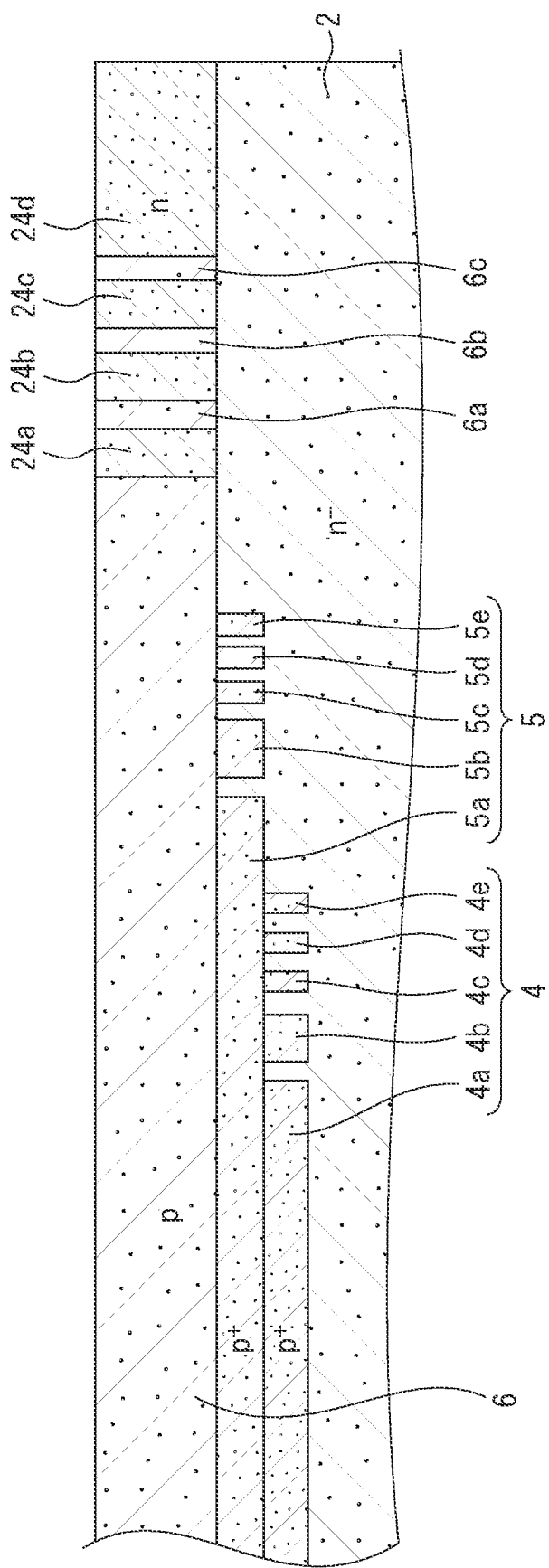
FIG. 12 is a process cross-sectional view continuing from FIG. 11 illustrating the example of the method of manufacturing the voltage blocking area of the semiconductor device according to the modified example of the first embodiment of the present invention.

After that, annealing is performed to activate the p-type impurity ions. As a result, as illustrated in FIG. 12, the n-type regions 24a, 24b, 24c, and 24d are formed by inverting (reversing) the polarities of the p-type base region 6. In addition, the base region 6 is sandwiched between the n-type regions 24a, 24b, 24c and 24d to form the p-type spatial-modulation portions 6a, 6b and 6c. Since other procedures are the same as those of the method of manufacturing the semiconductor device according to the first embodiment of the present invention, redundant description will be omitted.

Figure 13:
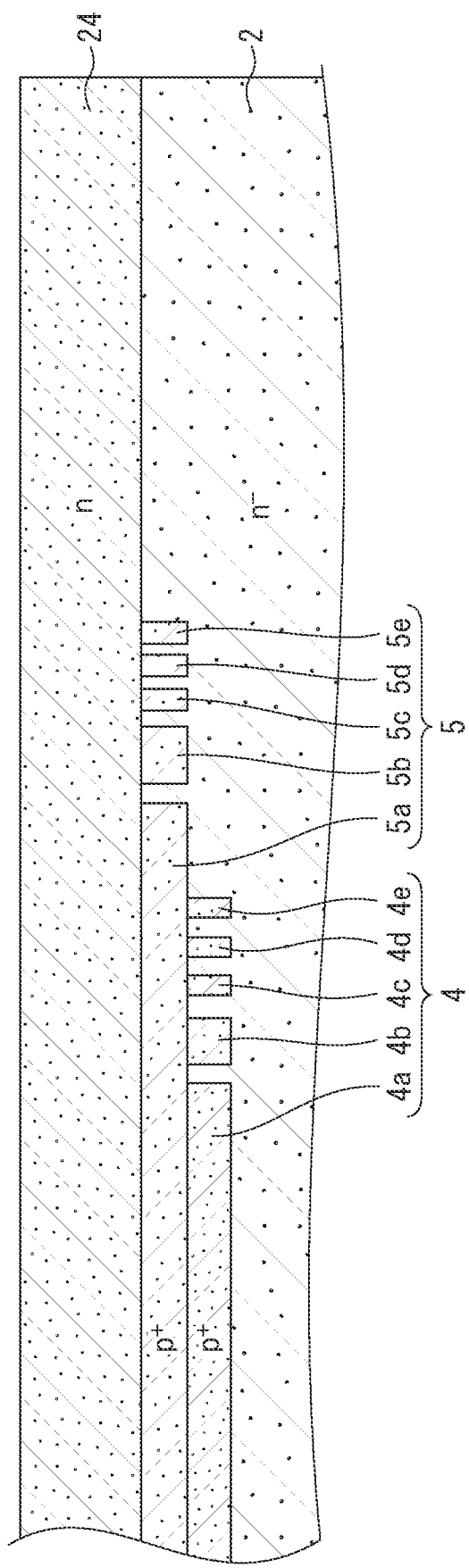
FIG. 13 is a process cross-sectional view illustrating another example of the method of manufacturing the voltage blocking area of the semiconductor device according to the modified example of the first embodiment of the present invention.

Alternatively, as another example of the method of manufacturing the semiconductor device according to the modified example of the first embodiment of the present invention, as illustrated in FIG. 13, the n-type region 24 may be epitaxially grown on the upper surface of the drift layer 2. After that, a photoresist film is coated on the upper surface of the n-type region 24, and the photoresist film is delineated by photolithography technique. By using the delineated photoresist film as an ion-implantation mask, p-type impurity ions such as Al are implanted with multiple acceleration energies. In this case, p-type impurity ions such as Al are also implanted with multiple projected-ranges into the region to be the p-type base region 6 of the active area 101 illustrated in FIG. 1.

Figure 14:
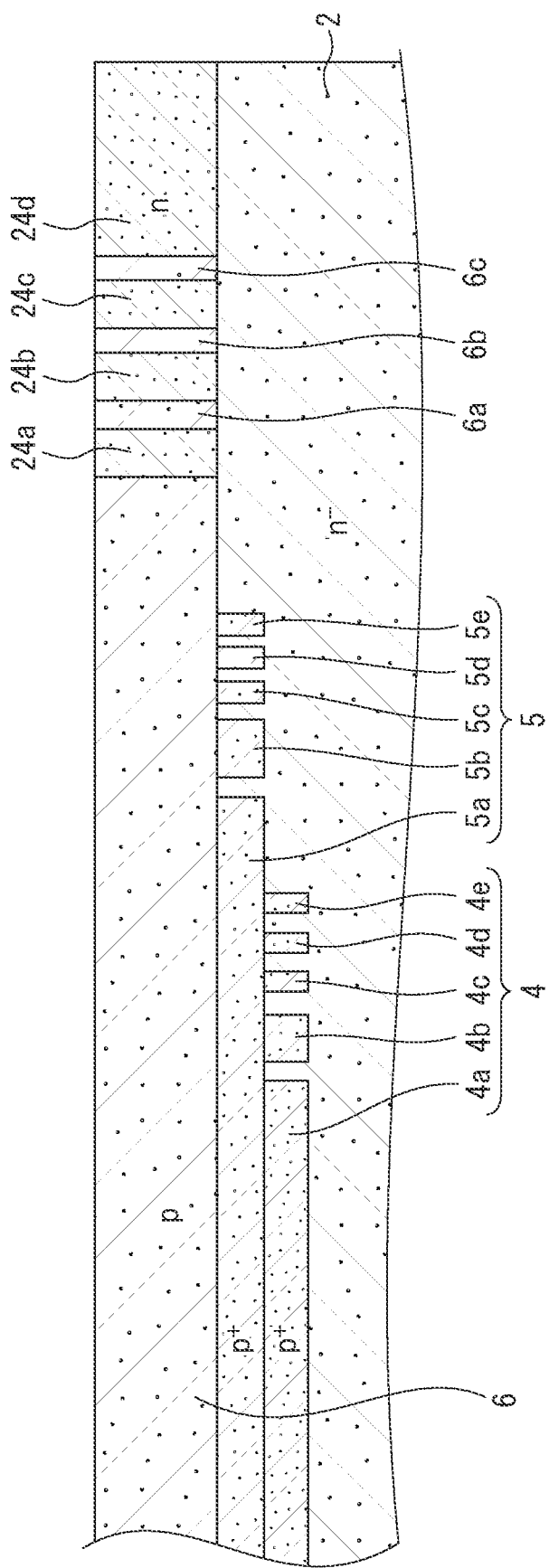
FIG. 14 is a process cross-sectional view continuing from FIG. 13 illustrating another example of the method of manufacturing the voltage blocking area of the semiconductor device according to the modified example of the first embodiment of the present invention.

After that, annealing is performed to activate the p-type impurity ions. As a result, as illustrated in FIG. 14, the p-type third electric-field relaxation-layer 6 and the spatial-modulation portions 6a, 6b, and 6c are formed by inverting (reversing) the polarity of the n-type region 24. In addition, n-type regions 24a, 24b, 24c, and 24d implemented by the remaining portions of the n-type region 24 are formed. At the same time, the p-type base region 6 in the active area 101 side illustrated in FIG. 1 is also formed.

Second Embodiment

Figure 15:
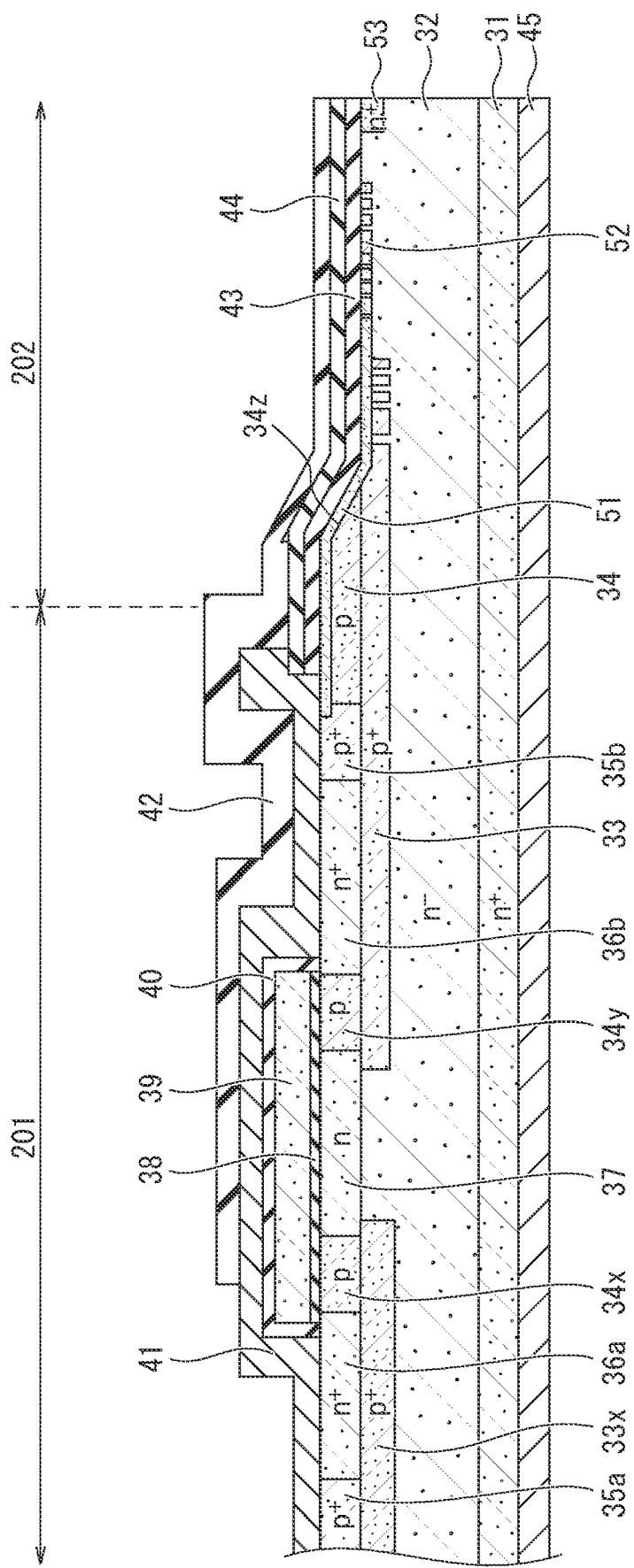
FIG. 15 is a cross-sectional view of a semiconductor device according to a second embodiment of the present invention.

As illustrated in FIG. 15, the semiconductor device according to the second embodiment of the present invention includes an active area 201 and a voltage blocking area 202 arranged around the active area 201. FIG. 15 illustrates a case where a MISFET having a planar gate structure provided in the upper portion of a drift layer 32 having a first conductivity type (n⁻-type) is included in the active area 201 as an active element.

Base regions 34x, 34y, and 34 having the second conductivity type (p-type) are arranged on the upper surface of the drift layer 32. Each of the drift layer 32 and the base regions 34x, 34y, and 34 is implemented by an epitaxial layer made of SiC. A plurality of n⁺-type first main-electrode regions (source regions) 36a and 36b, having an impurity concentration higher than that of the drift layer 32, is provided in the base regions 34x, 34y, and 34. A plurality of p⁺-type base-contact regions 35a and 35b, having an impurity concentration higher than that of the base regions 34x, 34y, 34, is provided in the base regions 34x, 34y, and 34 so as to be in contact with the source regions 36a and 36b.

In addition, in FIG. 15, the structure in which the source regions 36a and 36b and the base-contact regions 35a and 35b are provided so as to divide the base regions 34x, 34y, and 34 at the same depth as the base regions 34x, 34y, and 34 is exemplified. However, the present invention is not limited to the structure illustrated in FIG. 15. For example, the source regions 36a and 36b and the base-contact regions 35a and 35b may be provided in the upper portions of the base regions 34x, 34y, and 34.

An n-type junction field effect transistor (JFET) region 37 is arranged at a position sandwiched between the base regions 34x and 34y. In the upper portion of the drift layer 32, p$^+$-type base-bottom buried-regions 33x and 33 are provided to be separated from each other. The base-bottom buried-region 33x is in contact with the lower surfaces of the base-contact region 35a, the source region 36a, and the base region 34x. The base-bottom buried-region 33 is in contact with the lower surfaces of the base region 34y, the source region 36b, the base-contact region 35b, and the base region 34. The JFET region 37 is in contact with the upper surface of a convex portion of the drift layer 32 sandwiched between the base-bottom buried-regions 33x and 33.

The gate electrode 39 is arranged with the gate-insulating film 38 interposed between the gate electrode 39 and the base regions 34x and 34y and between the gate electrode 39 and the JFET region 37, over a range from the upper surfaces of the base regions 34x and 34y and the JFET region 37 to a portion of the upper surfaces of the source regions 36a and 36b. On the upper surface of the gate electrode 39, a first main-electrode (source electrode) 41 is arranged separately from a gate-surface electrode (not illustrated) located on the back of the paper surface with an interlayer-insulating film 40 interposed between the gate electrode 39 and the source electrode 41. The source electrode 41 is electrically connected to the source regions 36a and 36b and the base-contact regions 35a and 35b. A protective film 42 is arranged on the upper surface of the source electrode 41. Protective films 43 and 44 are arranged under the voltage blocking area 202 side of the protective film 42.

An n$^+$-type second main-electrode region (drain region) 31 is arranged on the lower surface of the drift layer 32. The drain region 31 is implemented by a SiC substrate. A second main-electrode (drain electrode) 45 is arranged on the lower surface of the drain region 31.

During the operation of the semiconductor device according to the second embodiment of the present invention, when a positive voltage is applied to the drain electrode 45 and a positive voltage equal to or higher than a threshold value is applied to the gate electrode 39, an inversion layer (channel) is formed on the surfaces of the base regions 34x and 34y close to the gate electrode 39, so that the semiconductor device can become conductive state. In the conductive state, a current flows from the drain electrode 45 to the source electrode 41 through the drain region 31, the drift layer 32, the JFET region 37, the inversion layers of the base regions 34x and 34y, and the source regions 36a and 36b. On the other hand, when the voltage applied to the gate electrode 39 is lower than the threshold value, the inversion layer is not formed in the base regions 34x and 34y, so that the semiconductor device can turn to the cut-off state, and no current flows from the drain electrode 45 to the source electrode 41.

As illustrated in FIG. 15, the base-bottom buried-region 33 extends from the active area 201 to the voltage blocking area 202 and functions as the electric-field relaxation-layer 33 in the voltage blocking area 202. The voltage blocking area 202 includes a p-type field relaxation region (33, 51, 52) provided in the upper portion of the drift layer 32. The depth of the outer end of each layer implementing the field relaxation region (33, 51, 52) decreases toward the outside, and the spatial-modulation pattern is provided respectively in the outer end side of each layer of the field relaxation region (33, 51, 52).

Figure 16:
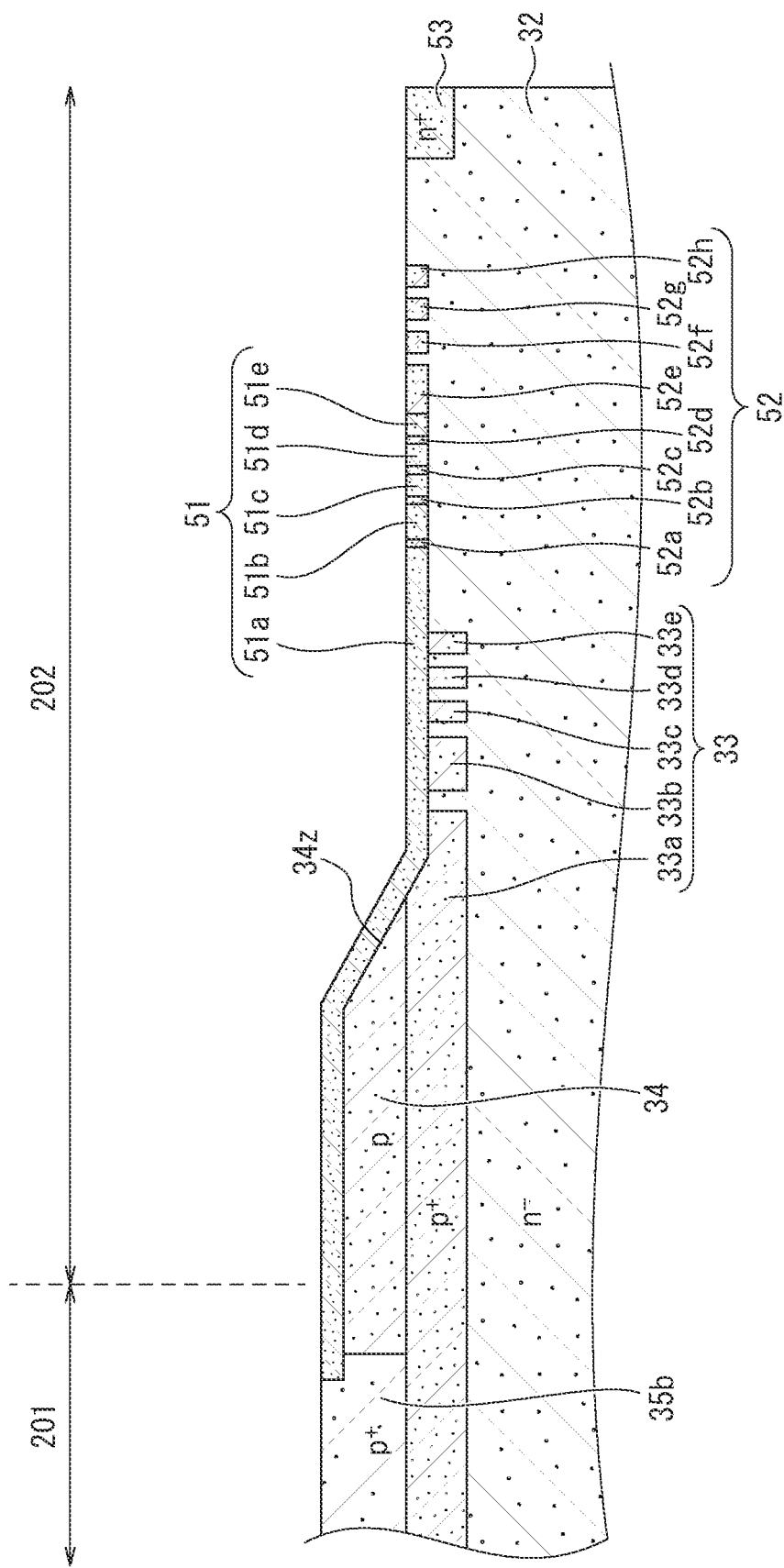
FIG. 16 is a cross-sectional view of a voltage blocking area of the semiconductor device according to the second embodiment of the present invention.

FIG. 16 illustrates a partial enlarged view of the upper portion of the drift layer 32 in the voltage blocking area 202 side illustrated in FIG. 15. In FIG. 16, the protective films 42, 43, 44 illustrated in FIG. 15 are omitted in illustration. As illustrated in FIG. 16, the field relaxation region (33, 51, 52) is implemented by an electric-field relaxation-layer 33 and a junction-termination structure-portion (51, 52) provided to the outer side of the electric-field relaxation-layer 33 so as to be in contact with the upper surface of the electric-field relaxation-layer 33.

The electric-field relaxation-layer 33 includes a main-body portion 33a continuous from the active area 201 and spatial-modulation portions 33b, 33c, 33d, and 33e provided outside the main-body portion 33a. The spatial-modulation portions 33b, 33c, 33d, and 33e are provided to be separated from each other in a concentric ring shape. For example, the spatial-modulation portions 33b, 33c, 33d, and 33e implement a spatial-modulation pattern of which the width becomes narrower and the interval becomes wider toward the outside.

The base region 34 includes a recessed portion 34z. The junction-termination structure-portion (51, 52) is provided from the base-contact region 35b to the vicinity of the outer end of the drift layer 32. The junction-termination structure-portion (51, 52) includes a p$^-$-type first JTE region 51 and a p$^{--}$-type second JTE region 52 provided outside the first JTE region 51 and having an impurity concentration lower than that of the first JTE region 51.

The first JTE region 51 includes a main-body portion 51a and spatial-modulation portions 51b, 51c, 51d, and 51e provided outside the main-body portion 51a at a horizontal level shallower than those of the spatial-modulation portions 33b, 33c, 33d, and 33e. The second JTE region 52 includes spatial-modulation portions 52a, 52b, 52c, and 52d provided alternately with respect to the spatial-modulation portions 51b, 51c, 51d, and 51e of the first JTE region 51 and spatial-modulation portions 52e, 52f, 52g, and 52h provided outside of the spatial-modulation portions 52a, 52b, 52c, and 52d. Since the junction-termination structure-portions (51, 52) have the same structure as that of the junction-termination structure-portions (21, 22) illustrated in FIGS. 1 and 2, redundant description will be omitted.

An n$^+$-type channel stopper 53 is provided in the upper portion of the drift layer 32 at the outer end of the voltage blocking area 202. In addition, a p$^+$-type channel stopper may be provided instead of the n$^+$-type channel stopper 53.

According to the semiconductor device pertaining to the second embodiment of the present invention, the depth of the outer end of each layer implementing the field relaxation region (33, 51, 52) decreases toward the outside, and a plurality of the spatial-modulation patterns having different depths of the lower ends are provided in the field relaxation region (33, 51, 52). As a result, the electric field crowding in the voltage blocking area 202 can be relaxed, so that the breakdown voltage can be improved. Therefore, a device having a higher breakdown voltage can be realized, and the margin of the active breakdown voltage and the edge breakdown voltage can be expanded.

Next, a method of manufacturing the semiconductor device according to the second embodiment of the present invention will be described with reference to FIGS. 17 to 21, while focusing on the voltage blocking area 202. In addition, the manufacturing method described below is merely an example and can be realized by various other manufacturing methods including this modified example as long as the manufacturing methods are included in the scope of the present invention disclosed in the claims.

Figure 17:
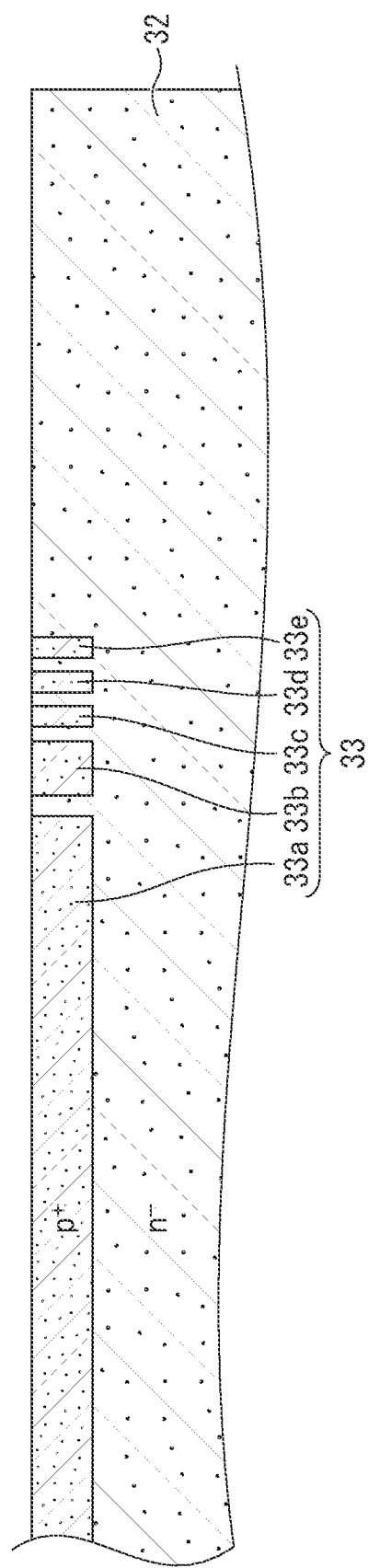
FIG. 17 is a process cross-sectional view illustrating an example of a method of manufacturing the voltage blocking area of the semiconductor device according to the second embodiment of the present invention.

First, an n$^+$-type SiC substrate to which n-type impurities such as nitrogen (N) are doped is prepared. An n$^-$-type drift layer 32 is epitaxially grown on the upper surface of the drain region 31 by using the n$^+$-type SiC substrate as the drain region 31. Next, a photoresist film is coated on the upper surface of the drift layer 32, and the photoresist film is delineated by photolithography technique. By using the delineated photoresist film as an ion-implantation mask, p-type impurity ions such as Al are implanted with multiple acceleration energies. After removal of the photoresist film, annealing is performed to activate the p-type impurity ions. As a result, as illustrated in FIG. 17, a p$^+$-Type base-bottom buried-region (electric-field relaxation-layer) 33 is formed in the upper portion of the drift layer 32. The electric-field relaxation-layer 33 includes a main-body portion 33a extending continuously from the active area 201 and spatial-modulation portions 33b, 33c, 33d, and 33e provided outside the main-body portion 33a. At the same time, in the active area 201 side illustrated in FIG. 15, the p$^+$-type base-bottom buried-region 33x is formed in the upper portion of the drift layer 32.

Figure 18:
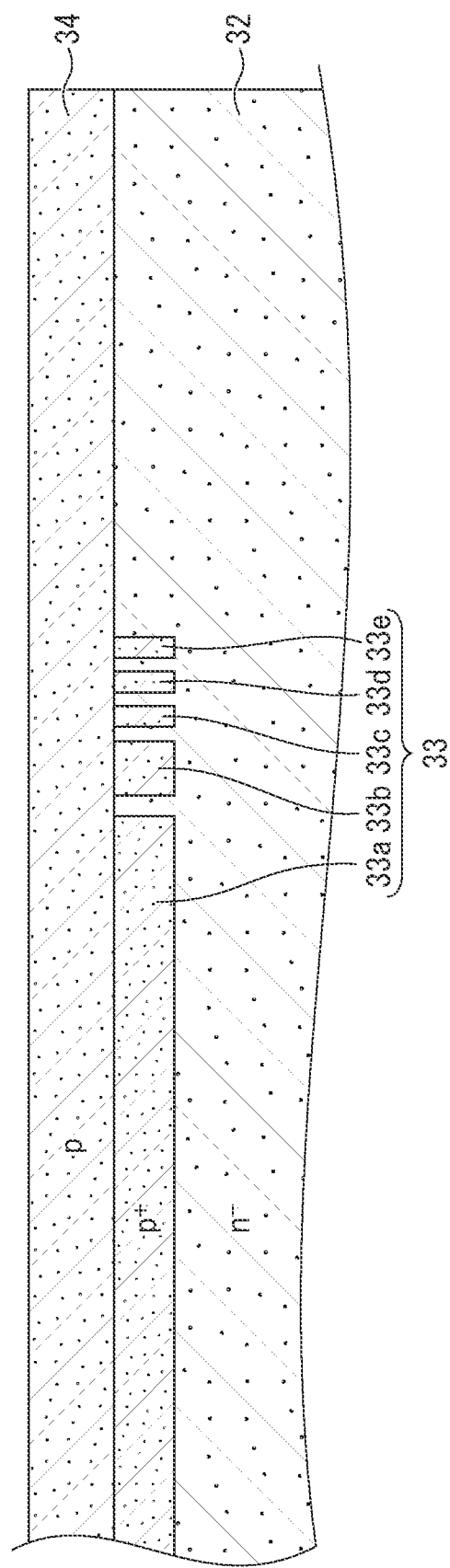
FIG. 18 is a process cross-sectional view continuing from FIG. 17 illustrating an example of the method of manufacturing the voltage blocking area of the semiconductor device according to the second embodiment of the present invention.
Figure 19:
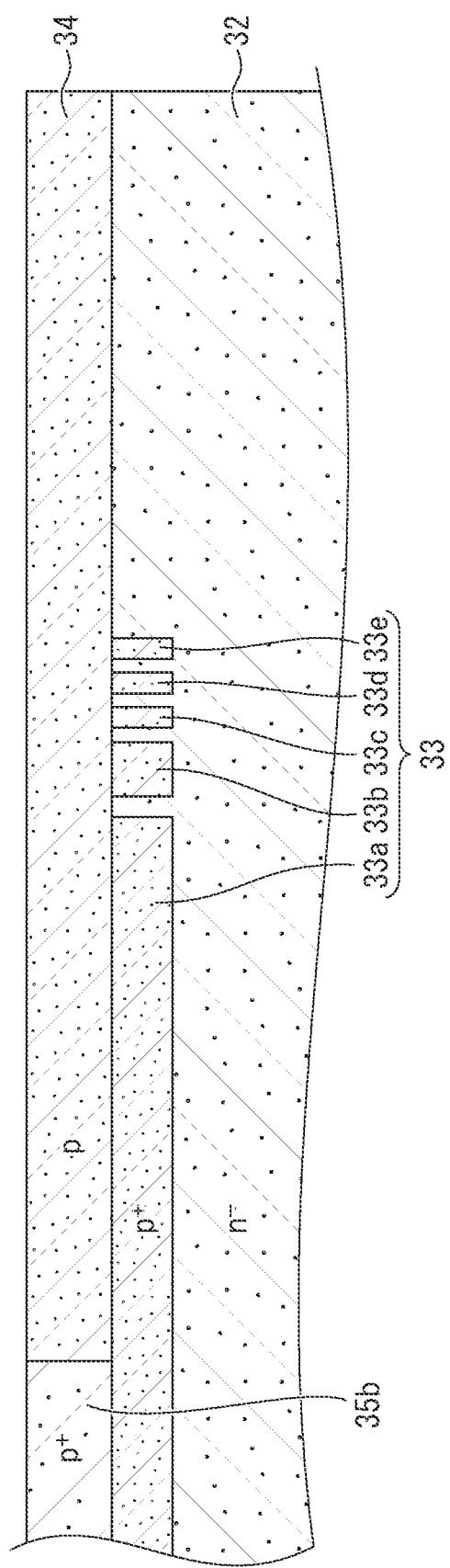
FIG. 19 is a process cross-sectional view continuing from FIG. 18 illustrating an example of the method of manufacturing the voltage blocking area of the semiconductor device according to the second embodiment of the present invention.

Next, as illustrated in FIG. 18, a p-type base region 34 is epitaxially grown on the upper surface of the drift layer 32. Then, a photoresist film is coated on the upper surface of the base region 34, and the photoresist film is delineated by photolithography technique. By using the delineated photoresist film as an ion-implantation mask, p-type impurity ions such as Al are implanted with multiple acceleration energies. After removal of the photoresist film, annealing is performed to activate the p-type impurity ions, and as illustrated in FIG. 19, a p$^+$-type base-contact region 35b is formed in the base region 34. At the same time, in the active area 201 side illustrated in FIG. 15, a p$^+$-type base-contact region 35a is formed in the base region 34.

Figure 20:
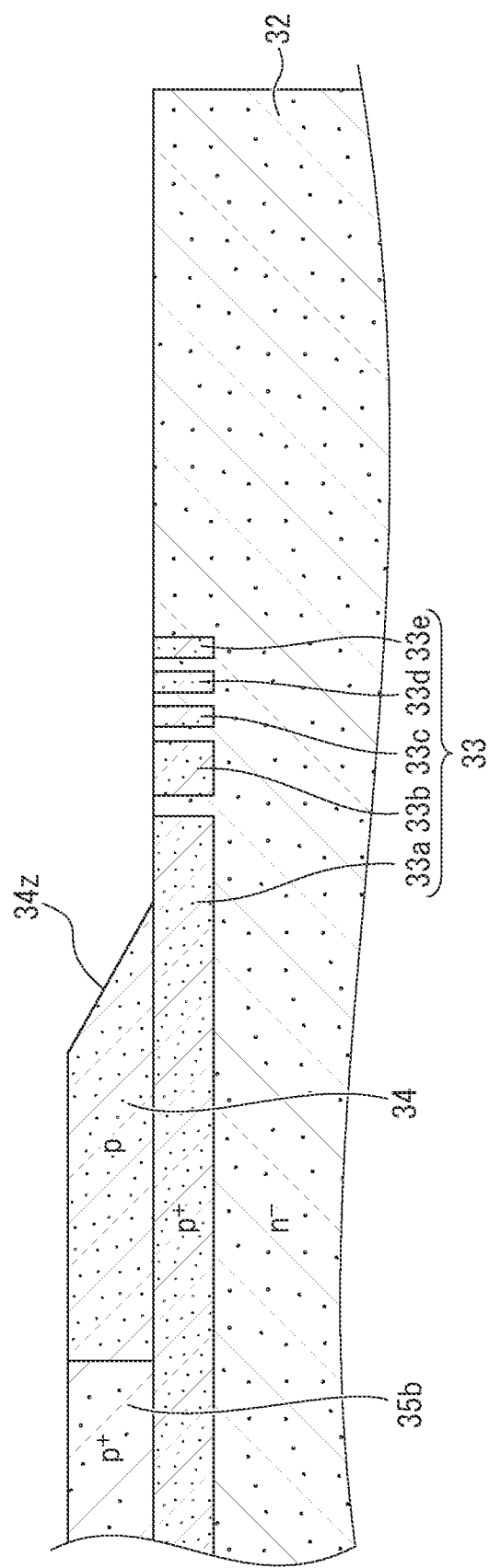
FIG. 20 is a process cross-sectional view continuing from FIG. 19 illustrating an example of the method of manufacturing the voltage blocking area of the semiconductor device according to the second embodiment of the present invention.

Next, a photoresist film is coated on the upper surface of the base region 34, and the photoresist film is delineated by photolithography technique. By using the delineated photoresist film as an etching mask, a portion of the base region 34 is selectively removed by wet etching or the like. After that, the photoresist film is removed by wet processing or the like. As a result, as illustrated in FIG. 20, a recessed portion 34z having a slope in the base region 34 is formed, and the upper surface of the drift layer 32 is exposed.

Figure 21:
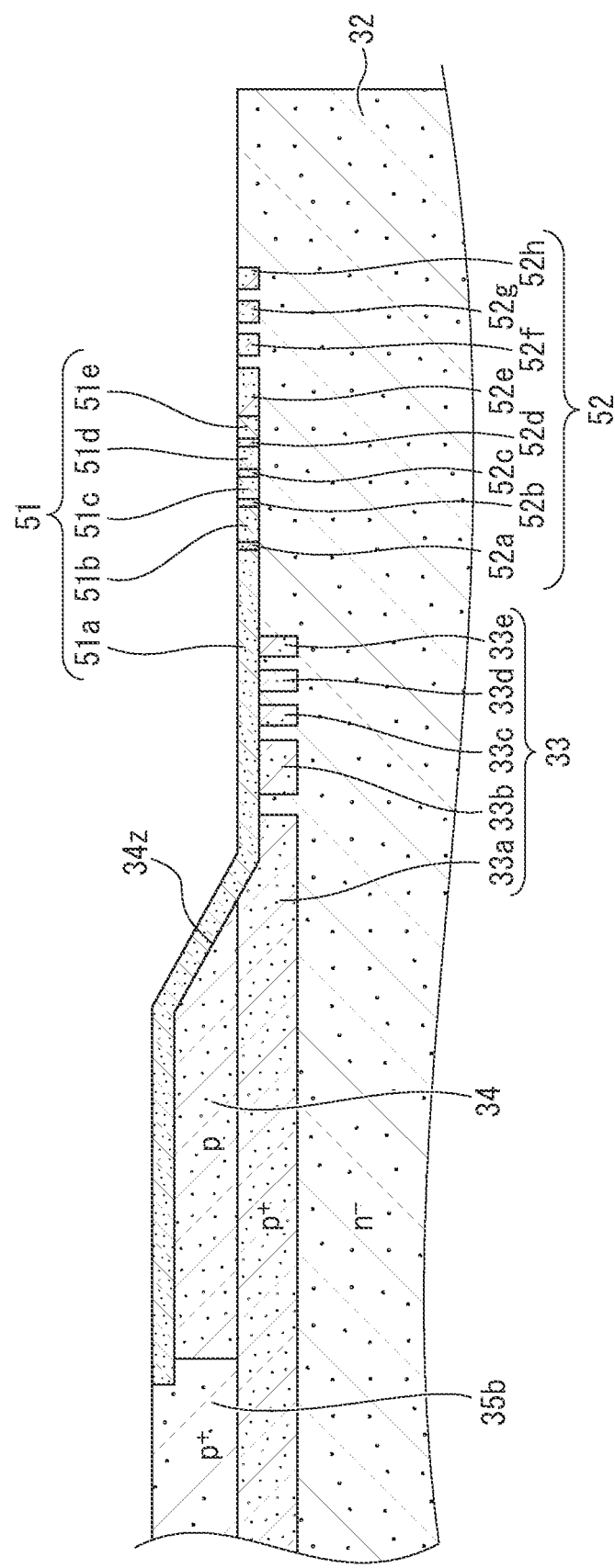
FIG. 21 is a process cross-sectional view continuing from FIG. 20 illustrating an example of the method of manufacturing the voltage blocking area of the semiconductor device according to the second embodiment of the present invention.

Next, as illustrated in FIG. 21, in a photolithography technique in which mask alignment is performed twice, by performing ion implantation correspondingly to the twice mask alignment, and after that, by annealing or the like, a p-type first JTE region 51 is formed. The p$^-$-type first JTE region 51 is formed so as to extend over the base-contact region 35b, the base region 34, the electric-field relaxation-layer 33, and the drift layer 32. For example, at the time of forming the first JTE region 51, a first ion-implantation mask delineated by photolithography technique is used for the center side (inner side) region. By using the first ion-implantation mask, n-type impurity ions such as N are selectively implanted with multiple projected-ranges into the p$^+$-type base-contact region 35b, the p-type base region 34, and the p$^+$-type field relaxation layer 33. On the other hand, In addition, with respect to the outer end side, by using a second ion-implantation mask delineated by photolithography technique, p-type impurity ions such as Al are selectively implanted with multiple projected-ranges into the n$^-$-type drift layer 32. After that, by annealing, a portion of the p-type impurities in the upper portions of the base-contact region 35b, the base region 34 and the electric-field relaxation-layer 33 are compensated by the activated n-type impurities, so that a p$^-$-type first JTE region 51 is formed. The implantation of p-type impurity ions using the second ion-implantation mask may be performed before the implantation of n-type impurity ions by using the first ion-implantation mask.

On the other hand, at the time of forming the p$^{--}$-type second JTE region 52 having an impurity concentration lower than that of the first JTE region 51 outside the first JTE region 51, p-type impurity ions such as Al at a dose smaller than that at the time of ion implantation of the first JTE region 51 are implanted with multiple projected-ranges into the drift layer 32. The annealing after the ion implantation may be performed together with the annealing at the time of forming the first JTE region 51.

According to the method of manufacturing a semiconductor device pertaining to the second embodiment of the present invention, the occurrence of electric field crowding in the voltage blocking area can be efficiently prevented by a plurality of the spatial-modulation patterns having different depths of the lower ends, so that it is possible to realize the semiconductor device capable of improving a breakdown voltage.

(Modified Example of Second Embodiment)

Figure 22:
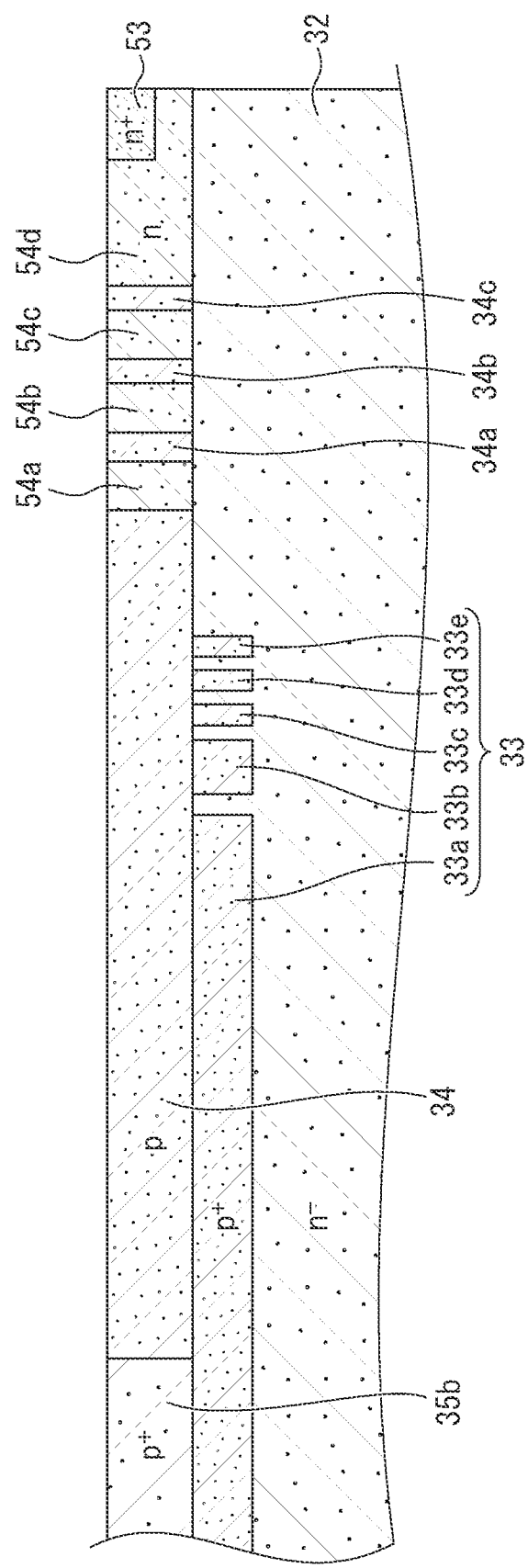
FIG. 22 is a cross-sectional view of a voltage blocking area of a semiconductor device according to a modified example of the second embodiment of the present invention.

FIG. 22 illustrates a voltage blocking area of a semiconductor device according to a modified example of the second embodiment of the present invention. As illustrated in FIG. 22, in the voltage blocking area of the semiconductor device according to the modified example of the second embodiment of the present invention, the p-type base region 34 provided on the upper surface of the drift layer 32 has no recessed portion and extends to the vicinity of the outer end of the voltage blocking area to function as the electric-field relaxation-layer 34.

In the voltage blocking area of the semiconductor device according to the modified example of the second embodiment of the present invention, the field relaxation region (33, 34, 34a, 34b, 34c) is implemented by the first electric-field relaxation-layer 33 and the second electric-field relaxation-layer 34 provided with the spatial-modulation portions 34a, 34b, and 34c. The second electric-field relaxation-layer 34 extends to the outer side of the first electric-field relaxation-layer 33 so as to be in contact with the upper surface of the first electric-field relaxation-layer 33. In the outer side of the second electric-field relaxation-layer 34, p-type spatial-modulation portions 34a, 34b, and 34c are provided in a concentric ring shape. The spatial-modulation portions 34a, 34b, and 34c are alternately provided with respect to the n-type regions 54a, 54b, 54c, and 54d. A channel stopper 53 is provided in the upper portion of the n-type region 54d located at the outer end of the voltage blocking area.

According to the semiconductor device of the modified example of the second embodiment of the present invention, since the field relaxation region (33, 34, 34a, 34b, 34c) is implemented by the first electric-field relaxation-layer 33 and the second electric-field relaxation-layer 34 provided with the spatial-modulation portions 34a, 34b, and 34c, it is possible to relax the electric field crowding in the voltage blocking area.

Figure 23:
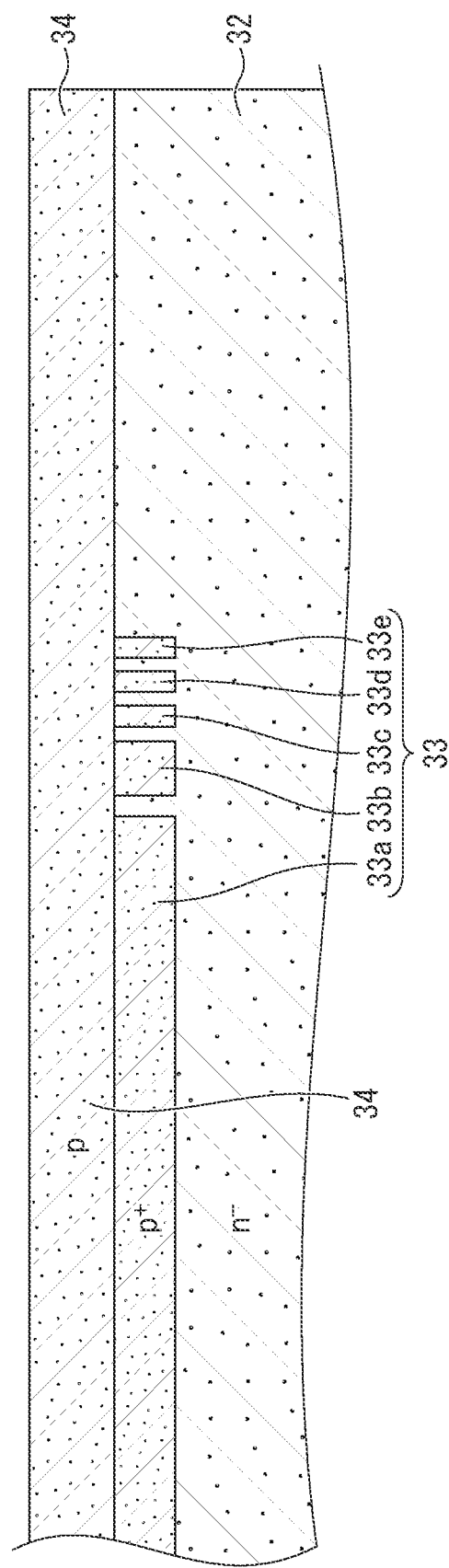
FIG. 23 is a process cross-sectional view illustrating an example of a method of manufacturing the voltage blocking area of the semiconductor device according to the modified example of the second embodiment of the present invention.

As an example of a method of manufacturing the semiconductor device according to the modified example of the second embodiment of the present invention, a p$^+$-type base-bottom buried-region (first electric-field relaxation-layer) 33 is formed in the upper portion of the drift layer 32 by the same procedure as those in FIG. 17. Then, as illustrated in FIG. 23, a p-type base region (second electric-field relaxation-layer) 34 is epitaxially grown on the upper surface of the drift layer 32. After that, a photoresist film is coated on the upper surface of the second electric-field relaxation-layer 34, and the photoresist film is delineated by photolithography technique. By using the delineated photoresist film as an ion-implantation mask, n-type impurity ions such as nitrogen (N) for forming the n-type regions 54*a*, 54*b*, 54*c* and 54*d* are implanted with multiple acceleration energies. At this time, n-type impurity ions such as nitrogen (N) are also implanted with multiple projected-ranges into the region which is to be the n-type JFET region 37 in the active area 201 illustrated in FIG. 15.

Figure 24:
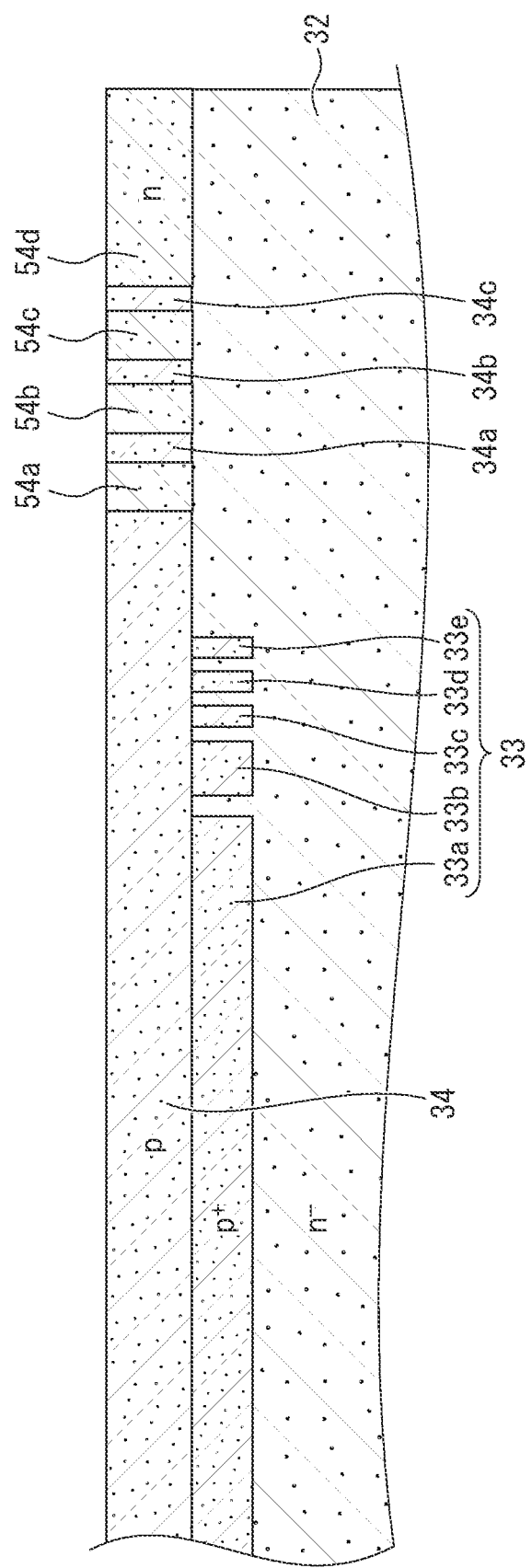
FIG. 24 is a process cross-sectional view continuing from FIG. 23 illustrating the example of the method of manufacturing the voltage blocking area of the semiconductor device according to the modified example of the second embodiment of the present invention.

After that, annealing is performed to activate the n-type impurity ions. As a result, as illustrated in FIG. 24, n-type regions 54*a*, 54*b*, 54*c*, and 54*d* are formed in the second electric-field relaxation-layer 34. In addition, the second electric-field relaxation-layer 34 is sandwiched between the n-type regions 54*a*, 54*b*, 54*c*, and 54*d* to form the p-type spatial-modulation portions 34*a*, 34*b*, and 34*c*. At the same time, the n-type JFET region 37 of the active area 201 side illustrated in FIG. 15 is also formed.

Figure 25:
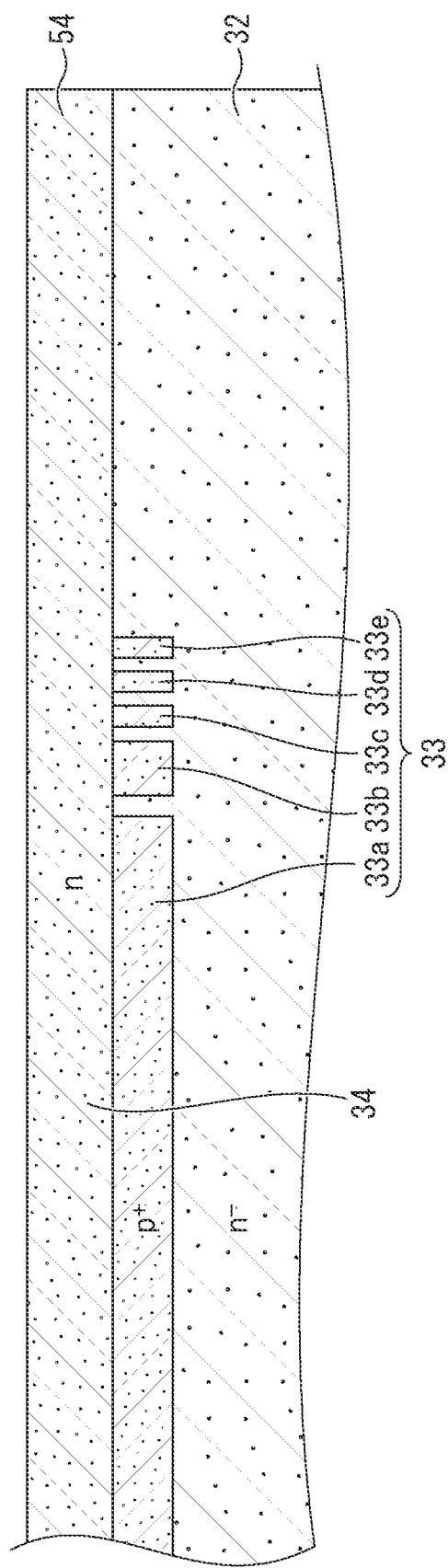
FIG. 25 is a process cross-sectional view illustrating another example of the method of manufacturing the voltage blocking area of the semiconductor device according to the modified example of the second embodiment of the present invention.

Alternatively, as another example of the method of manufacturing the semiconductor device according to the modified example of the second embodiment of the present invention, as illustrated in FIG. 25, the n-type region 54 may be epitaxially grown on the upper surface of the drift layer 32. After that, a photoresist film is coated on the upper surface of the n-type region 54, and the photoresist film is delineated by photolithography technique. By using the delineated photoresist film as an ion-implantation mask, p-type impurity ions such as Al are implanted with multiple acceleration energies. At this time, p-type impurity ions such as Al are also implanted with multiple projected-ranges into the regions which are to be the p-type base regions 34*x* and 34*y* of the active area 201 illustrated in FIG. 15.

Figure 26:
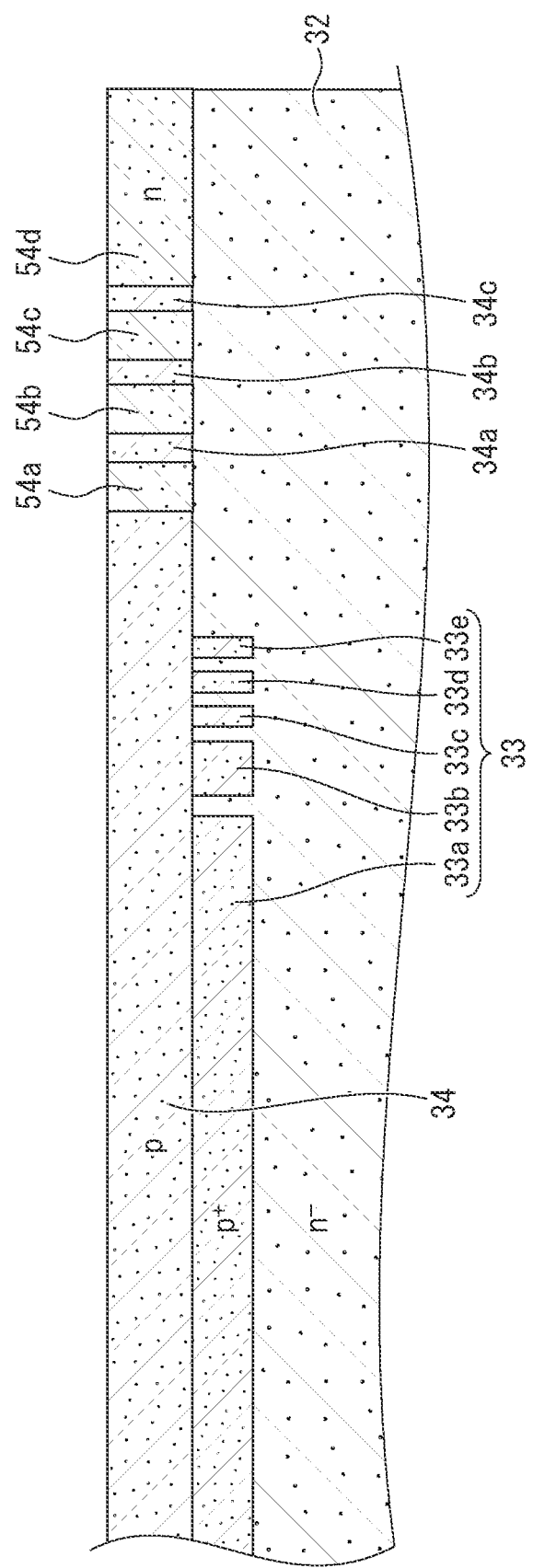
FIG. 26 is a process cross-sectional view continuing from FIG. 25 illustrating another example of a method of manufacturing the voltage blocking area of the semiconductor device according to the modified example of the second embodiment of the present invention.

After that, annealing is performed to activate the p-type impurity ions. As a result, as illustrated in FIG. 26, the p-type second electric-field relaxation-layer 34 and the spatial-modulation portions 34*a*, 34*b*, and 34*c* are formed by inverting (reversing) the polarity of the n-type region 54. In addition, n-type regions 54*a*, 54*b*, 54*c*, and 54*d* implemented by the remaining portions of the n-type region 54 are formed. At the same time, the p-type base regions 34*x* and 34*y* of the active area 201 illustrated in FIG. 15 are also formed.

Other Embodiments

As described above, the present invention has been described according to the embodiments, but it should not be understood that the description and drawings implementing a portion of this disclosure limit the present invention. It will be apparent to those skilled in the art that various alternative embodiments, examples, and operational techniques can be available from the disclosure.

In the first embodiment, the MISFET having a trench structure is exemplified. However, the present invention is not limited to the MISFET and can be applied to semiconductor devices having various trench structures such as an IGBT having a trench structure. As a trench-gate type IGBT, a structure in which the n$^+$-type source region 8 of the MISFET illustrated in FIG. 1 is used as an emitter region and a p$^+$-type collector region is provided on the lower surface side of the drift layer 2 instead of the n$^+$-type drain region 1 may be employed.

In the embodiments of the present invention, the semiconductor device using SiC is exemplified. However, the present invention may also be applied to a semiconductor device using another wide band gap semiconductor such as gallium nitride (GaN) or diamond. In addition, the present invention is not limited to a wide band gap semiconductor but may also be applied to a semiconductor device using silicon (Si).

What is claimed is:

1. A semiconductor device, comprising:
    an active area including a drift layer of a first conductivity type; and
    a voltage blocking area arranged around the active area and including a field relaxation region having a second conductivity type, being provided in an upper portion of the drift layer, the field relaxation region including:
        a first layer having the second conductivity type, provided in an inner portion of the drift layer, and
        a second layer having the second conductivity type, provided above the first layer, an outer end of the second layer being closer to an outer end of the drift layer than an outer end of the first layer is to the outer end of the drift layer, and
    wherein the first layer includes a first body portion and a first spatial-modulation portion provided so as to extend from a bottom surface of the second layer and to be spaced apart from an outer end of the first body portion.

2. The semiconductor device of claim 1, wherein an impurity concentration of the second layer is less than an impurity concentration of the first layer.

3. The semiconductor device of claim 1, wherein an impurity concentration of the second layer decreases from the inner portion of the drift layer toward the outer end of the drift layer.

4. The semiconductor device of claim 1, wherein
    at least a portion of the bottom surface of the second layer is in contact with and faces at least a portion of an upper surface of the first layer, and
    the second layer includes a second body portion and a second spatial-modulation portion spaced apart from an outer end of the second body portion.

5. The semiconductor device of claim 4, wherein
    the field relaxation region further includes:
        a junction-termination structure-portion having the second conductivity type and an impurity concentration lower than that of the second layer, provided to an outer side of the second layer, and a portion of a bottom surface of the junction-termination structure-portion is in contact with and faces at least a portion of an upper surface of the second layer, and
    wherein the junction-termination structure-portion includes a junction-termination body portion and a junction-termination spatial-modulation portion spaced apart from an outer end of the junction-termination body portion.

6. The semiconductor device of claim 4, wherein
    the field relaxation region further includes:
        a third layer having the second conductivity type and an impurity concentration lower than that of the second layer, provided on an upper surface of the drift layer so as to have at least a portion of a bottom surface of the third layer be in contact with and face at least a portion of an upper surface of the second layer, and
    wherein the third layer includes a third body portion and a third spatial-modulation portion spaced apart from an outer end of the third body portion.

7. The semiconductor device of claim 1, wherein
    the field relaxation region further includes:

a first junction termination region having a first junction termination region body portion and a first junction termination region spatial-modulation portion spaced apart from an outer end of the first junction termination region body portion, and a second junction termination region provided at an outer side of the first junction termination region body portion at a same depth as that of the first junction termination region and having at least one second junction termination region spatial-modulation portion spaced apart from an outer end of the first junction termination region.

8. The semiconductor device of claim 1, wherein
the second layer is a junction-termination structure-portion having an impurity concentration lower than the first layer, and
wherein the junction-termination structure-portion includes a junction-termination body portion and a second spatial-modulation portion spaced apart from an outer end of the junction-termination body portion.

9. The semiconductor device of claim 1, wherein
the second layer has an impurity concentration lower than that of the first layer,
the second layer is provided on an upper surface of the drift layer at an outer side of the first layer,
at least a portion of the bottom surface of the second layer is in contact with and faces at least a portion of an upper surface of the first layer, and
the second layer includes a second body portion and a second spatial-modulation portion spaced apart from an outer end of the second body portion.

10. The semiconductor device of claim 1, wherein the spatial-modulation portion has a same impurity concentration as the first body portion.

11. A semiconductor device, comprising:
an active area including a drift layer of a first conductivity type; and
a voltage blocking area arranged around the active area and including a field relaxation region having a second conductivity type, being provided in an upper portion of the drift layer, the field relaxation region including:
a first layer having the second conductivity type, provided in an inner portion of the drift layer, and
a second layer having the second conductivity type, provided above the first layer, a distance from a bottom surface of the second layer to a bottom portion of the drift layer being greater than a distance from a bottom surface of the first layer to the bottom portion of the drift layer, and
wherein the first layer includes a first body portion and a first spatial-modulation portion provided so as to be spaced apart from an outer end of the first body portion, a distance from a bottom surface of the first body portion to the bottom portion of the drift layer being the same as a distance from a bottom surface of the first spatial-modulation portion to the bottom portion of the drift layer.

12. The semiconductor device of claim 11, wherein the first layer includes a plurality of spatial-modulation portions spaced apart from one another in a concentric ring shape, the plurality of spatial-modulation portions including the first spatial-modulation portion.

13. The semiconductor device of claim 12, wherein a respective width of each of the plurality of spatial-modulation portions decreases in a direction from the inner portion of the drift layer toward an outer portion of the drift layer.

14. The semiconductor device of claim 13, wherein an interval between adjacent spatial-modulation portions among the plurality of spatial-modulation portions increases in a direction from the inner portion of the drift layer toward the outer portion of the drift layer.

15. A semiconductor device, comprising:
an active area including a drift layer of a first conductivity type; and
a voltage blocking area arranged around the active area and including a field relaxation region having a second conductivity type, being provided in an upper portion of the drift layer, the field relaxation region including:
a first electric-field relaxation-layer having the second conductivity type, provided in an inner portion of the drift layer, and
a second electric-field relaxation-layer having the second conductivity type, extending farther to an outer portion of the drift layer than the first electric-field relaxation-layer and having a bottom surface at least partially in contact with and facing an upper surface of the first electric-field relaxation-layer,
wherein
the first electric-field relaxation-layer includes a first body portion and a first spatial-modulation portion spaced apart from an outer end of the first body portion,
the second electric-field relaxation-layer includes a second body portion and a second spatial-modulation portion spaced apart from an outer end of the second body portion,
a distance from a bottom surface of the outer end of the first body portion to a bottom portion of the drift layer is less than a distance from a bottom surface of the outer end of the second body portion to the bottom portion of the drift layer, and
a distance from a bottom surface of the first spatial-modulation portion to the bottom portion of the drift layer is less than a distance from a bottom surface of the second spatial-modulation portion to the bottom portion of the drift layer.

16. The semiconductor device of claim 15, wherein a thickness of the first spatial-modulation portion is greater than a thickness of the second spatial-modulation portion.

* * * * *